(12) United States Patent
Lim et al.

(10) Patent No.: US 9,153,590 B2
(45) Date of Patent: Oct. 6, 2015

(54) SEMICONDUCTOR DEVICES INCLUDING BURIED CHANNELS

(71) Applicant: Samsung Electronics Co., Ltd., Suwon-si, Gyeonggi-do (KR)

(72) Inventors: Han-Jin Lim, Seoul (KR); Won-Seok Yoo, Hwaseong-si (KR); Seok-Woo Nam, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/297,220

(22) Filed: Jun. 5, 2014

(65) Prior Publication Data

US 2015/0124521 A1    May 7, 2015

(30) Foreign Application Priority Data

Nov. 5, 2013    (KR) .................. 10-2013-0133576

(51) Int. Cl.
  *G11C 11/00* (2006.01)
  *H01L 27/108* (2006.01)
(52) U.S. Cl.
  CPC .... H01L 27/10814 (2013.01); H01L 27/10855 (2013.01); *H01L 27/10823* (2013.01)
(58) Field of Classification Search
  CPC ................................ G11C 11/24; H01L 21/84
  USPC .......................................... 365/149; 257/301
  See application file for complete search history.

(56) References Cited

U.S. PATENT DOCUMENTS

| 8,343,864 B2 | 1/2013 | Goyal et al. | |
| 2006/0262592 A1* | 11/2006 | Farrar | 365/149 |
| 2010/0085800 A1* | 4/2010 | Yeom | 365/149 |
| 2010/0140676 A1* | 6/2010 | Yeom | 257/296 |
| 2011/0057260 A1* | 3/2011 | Kadoya | 257/334 |
| 2011/0233778 A1 | 9/2011 | Lee et al. | |
| 2012/0049256 A1* | 3/2012 | Lim et al. | 257/296 |
| 2013/0115768 A1 | 5/2013 | Pore et al. | |

FOREIGN PATENT DOCUMENTS

| KR | 100436057 B1 | 6/2004 |
| KR | 1020050090831 A | 9/2005 |
| KR | 100778881 B1 | 11/2007 |
| KR | 100880377 B1 | 1/2009 |
| KR | 1020090090181 A | 8/2009 |
| KR | 1020110001721 A | 1/2011 |
| KR | 1020110016218 A | 2/2011 |
| KR | 1020110063204 A | 6/2011 |
| KR | 1020110118981 A | 11/2011 |
| KR | 1020110124461 A | 11/2011 |
| KR | 1020120012289 A | 2/2012 |
| KR | 1020120051820 A | 5/2012 |
| KR | 1020120128518 A | 11/2012 |
| KR | 1020130036947 A | 4/2013 |

* cited by examiner

*Primary Examiner* — Michael Tran
(74) *Attorney, Agent, or Firm* — Myers Bigel Sibley & Sajovec, P.A.

(57) ABSTRACT

A semiconductor device and a method of fabricating the same are provided. The semiconductor device includes an active region defined by a device isolation layer formed in a cell region, a transistor including a buried gate in the active region, a metal contact formed on the active region positioned at one side of the buried gate, a landing pad on the metal contact, a capacitor on the landing pad and electrically connected to the active region, and a metal oxide layer between the metal contact and the active region.

20 Claims, 33 Drawing Sheets

FIG. 2
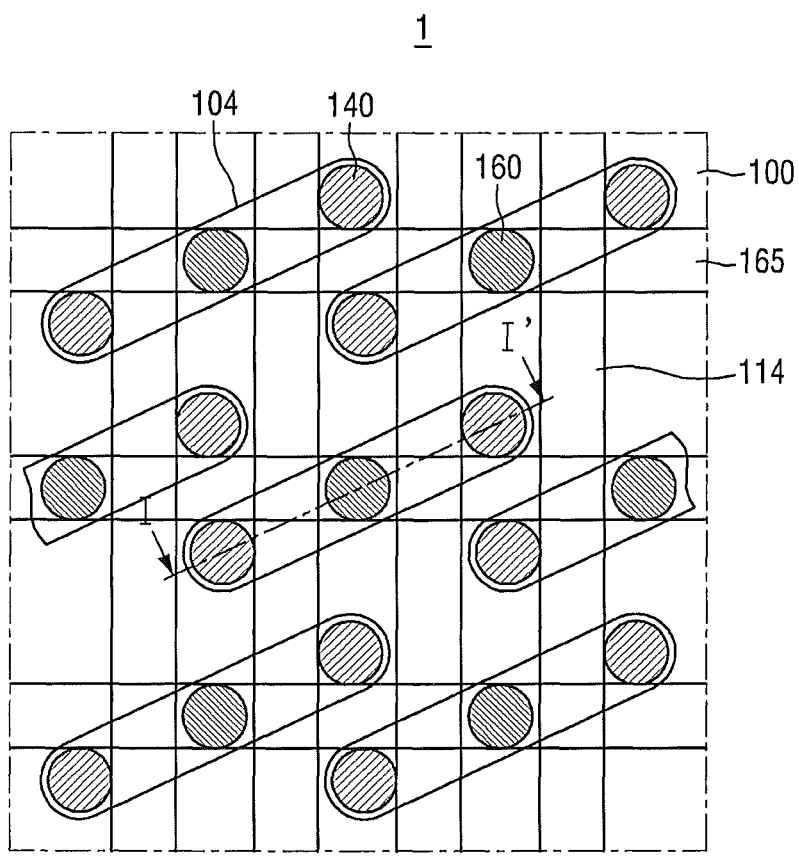
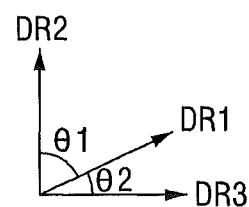

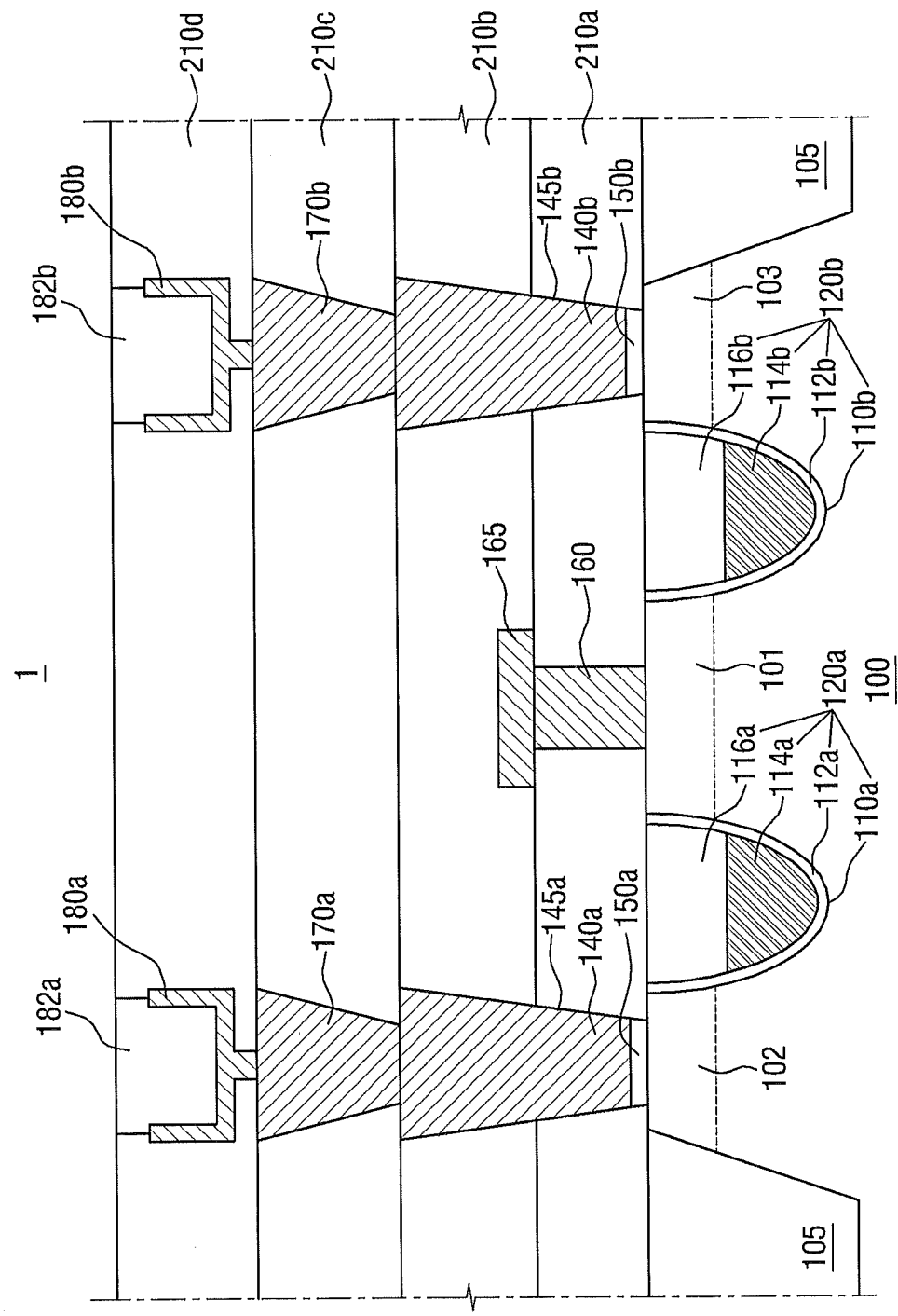

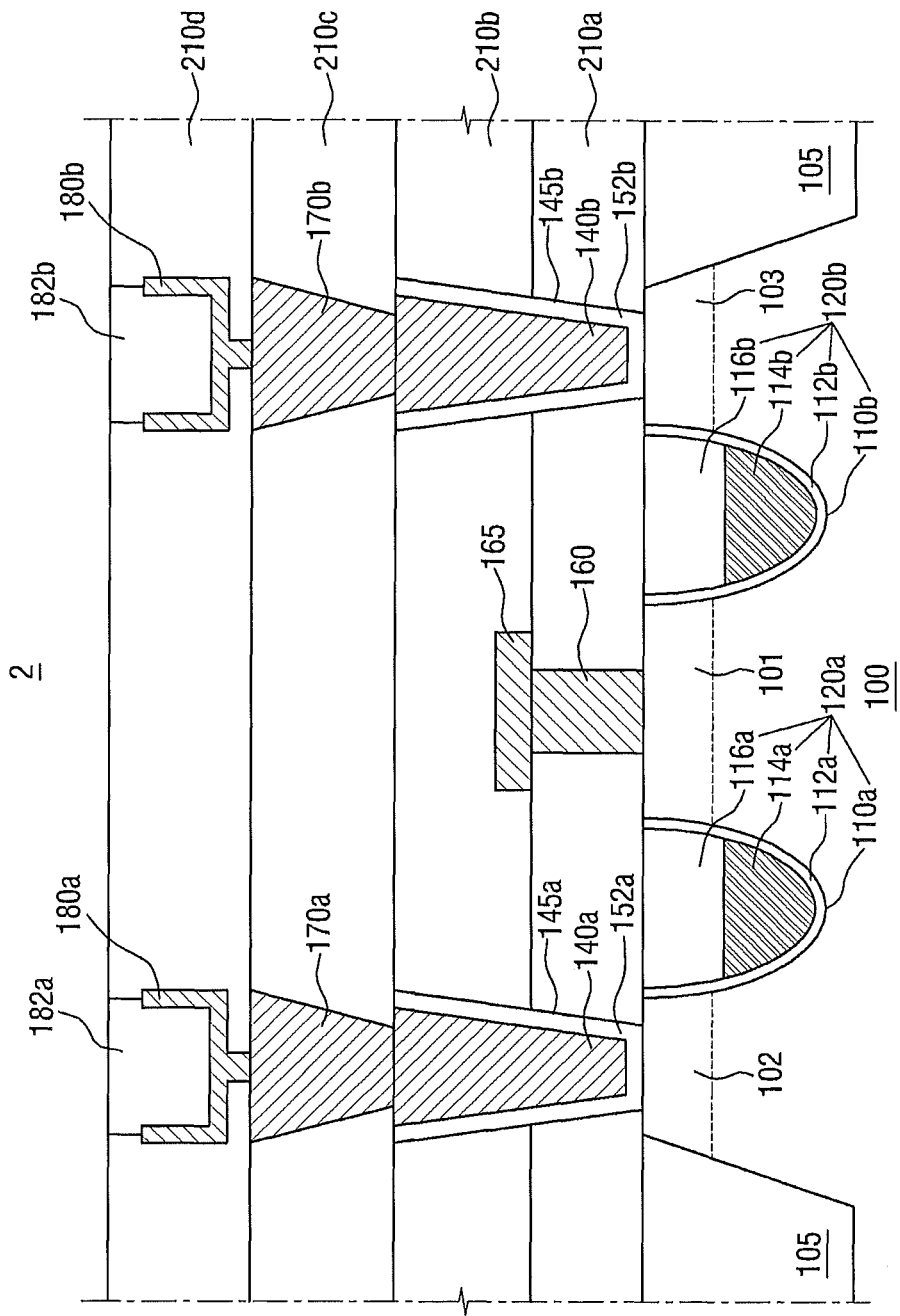

400

1200

1300

SEMICONDUCTOR DEVICES INCLUDING BURIED CHANNELS

CROSS-REFERENCE TO RELATED APPLICATION

This application claims priority from Korean Patent Application No. 10-2013-0133576 filed on Nov. 5, 2013 in the Korean Intellectual Property Office, and all the benefits accruing therefrom under 35 U.S.C. 119, the disclosure of which in is incorporated herein by reference in its entirety.

BACKGROUND

1. Field of the Invention

The present inventive concept relates to semiconductor devices and methods of forming semiconductor devices.

2. Description of the Related Art

As feature sizes of semiconductor memory devices are reduced, short channel effects have become more and more problematic. To overcome short channel effects, a buried channel array transistor (BCAT) structure, including a gate electrode buried in a trench, has been proposed. However, various characteristics of BCAT devices, including, for example, gate induced drain leakage (GIDL), current amount, etc., may vary depending on how much the gate electrode is buried in the trench.

SUMMARY

The present inventive concept provides semiconductor devices, that can have improved current handling and gate induced drain leakage (GIDL) characteristics.

The present inventive concept also provides methods of forming a semiconductor device, which can improve both current handling capability and GIDL characteristics.

These and other objects of the present inventive concept will be described in or be apparent from the following description of the preferred embodiments.

According to an aspect of the present inventive concept, there is provided a semiconductor device including an active region defined by a device isolation layer formed in a cell region, a buried transistor provided in the active region, a metal contact formed on the active region positioned at one side of the buried transistor, a landing pad formed on the metal contact, a capacitor formed on the landing pad and electrically connected to the active region, and a metal oxide layer formed between the metal contact and the active region.

According to another aspect of the present inventive concept, there is provided a semiconductor device including a memory cell array including a plurality of memory cells to store data; a row decoder activating a selected word line of the memory cell array; and a sense amplifier reading data from a selected bit line of the memory cell array, wherein each of the plurality of memory cells includes a cell capacitor, and a buried transistor connected between a bit line and the cell capacitor, and the buried transistor includes an active region defined by a device isolation layer formed in a cell region, a buried channel array transistor buried transistor provided in the active region, a metal contact formed on the active region positioned at one side of the buried transistor, and a metal oxide layer formed between the metal contact and the active region.

According to still another aspect of the present inventive concept, there is provided a fabricating method of a semiconductor device, the fabricating method including forming a unit active region defined as a shallow trench isolation (STI) on a substrate, forming a trenches in the unit active region, forming a gate insulation films along bottom surfaces and sidewalls of the trenches, forming a gate electrodes filling portions of the trenches, forming a first interlayer dielectric film on the unit active region, forming a first contact hole exposing the unit active region in the first interlayer dielectric film, forming a metal oxide layers in the first contact hole, and forming a storage node contacts filling the first contact hole.

BRIEF DESCRIPTION OF THE DRAWINGS

The above and other features and advantages of the present inventive concept will become more apparent by describing in detail preferred embodiments thereof with reference to the attached drawings in which:

FIG. 2 is a layout view of a memory cell array shown in FIG. 1;

FIG. 3 is a cross-sectional view of the semiconductor device shown in FIG. 1;

FIG. 5 is a cross-sectional view of a semiconductor device according to a second embodiment of the present inventive concept;

DETAILED DESCRIPTION OF THE EMBODIMENTS

Figure 1:
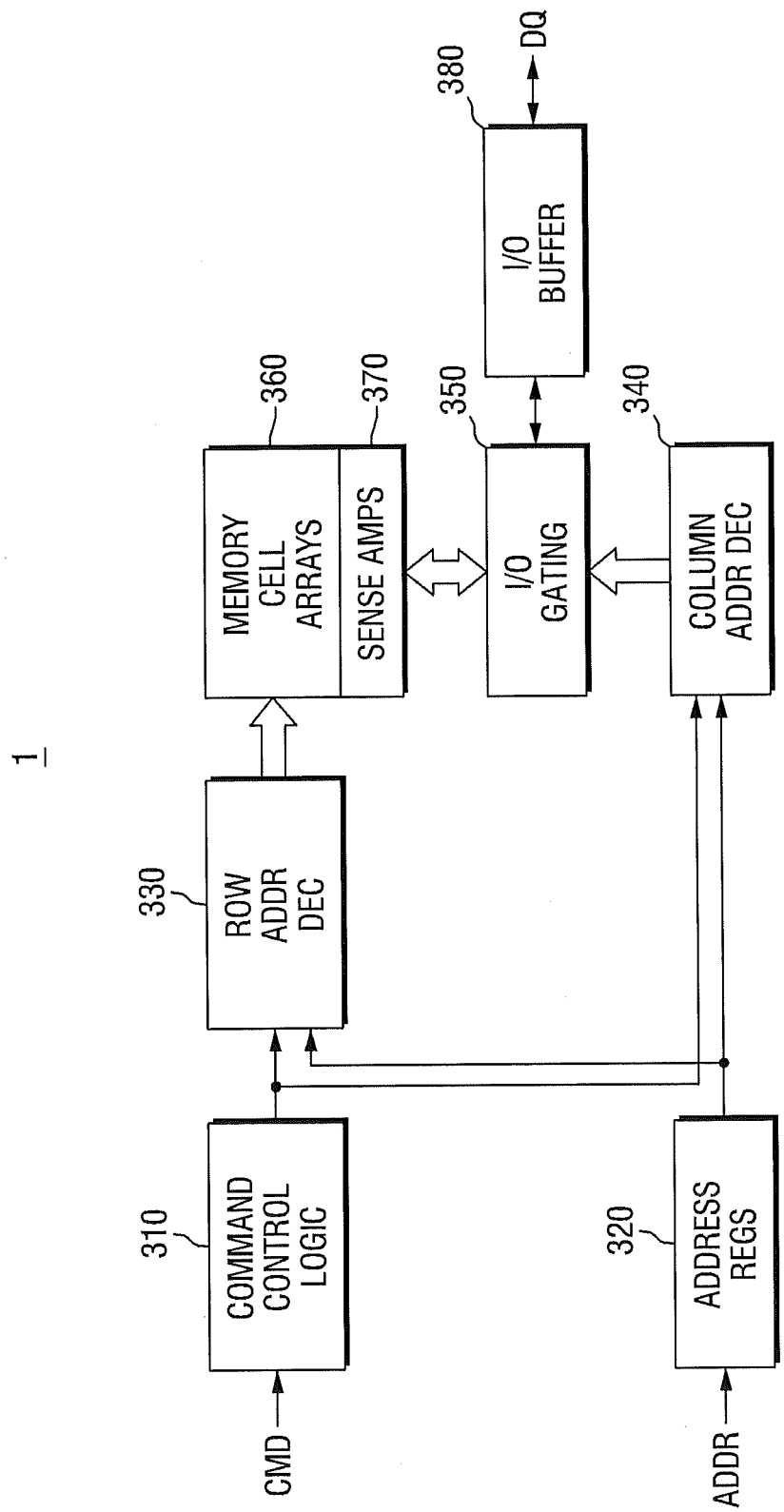
FIG. 1 is a block diagram of a semiconductor device according to a first embodiment of the present inventive concept.

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, embodiments of the present inventive concept will now be described with reference to the accompanying drawings.

FIG. 1 is a block diagram of a semiconductor device according to a first embodiment of the present inventive concept.

In the following description, a semiconductor device 1 according to the embodiment of the present inventive concept will be described with regard to a memory device by way of example.

Referring to FIG. 1, the memory device includes a command control logic 310, an address register 320, a row address decoder 330, a column address decoder 340, an input/output (I/O) gating circuit 350, a memory cell array 360, a sense amplifier 370 and an input/output (I/O) buffer 380.

Figure 11:
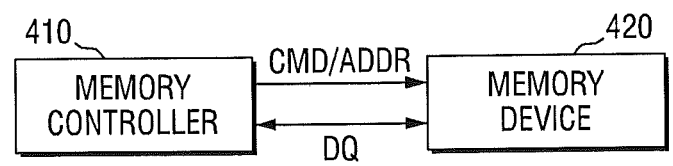
FIG. 11 is a block diagram of a memory system including the semiconductor device shown in FIG. 1.

The command control logic 310 may receive a command CMD from a memory controller (410 of FIG. 11) to control the operation of the memory device (420 of FIG. 11). For example, the command control logic 310 decodes the command CMD, including a write enable signal /WE, a row address strobe signal /RAS, a column address strobe signal /CAS, a chip select signal /CS, and so on, and may generate control signals. The command control logic 310 may provide the control signals to the row address decoder 330 and the column address decoder 340 to allow the memory device to perform a write, a read or an erase operation.

The address register 320 may receive an address ADDR from an external device (for example, a memory controller (410 of FIG. 11). For example, the address register 320 may receive the address ADDR including a row address signal ROW_ADDR and a column address signal COL_ADDR. In addition, the address register 320 may receive a bank address signal BANK_ADDR. The address register 320 may supply the received row address signal ROW_ADDR and the received column address signal COL_ADDR to the row address decoder 330 and the column address decoder 340, respectively.

The row address decoder 330 may activate a word line WL of the memory cell array 360 corresponding to the row address signal ROW_ADDR. The column address decoder 340 may activate the sense amplifier 370 corresponding to the column address signal COL_ADDR through the I/O gating circuit 350.

The memory cell array 360 may include a plurality of memory cells for storing data. The memory cell array 360 may include a plurality of word lines WLs and a plurality of bit lines BLs and each memory cell may be connected to one word line WL and one bit line BL. The plurality of memory cells may constitute a plurality of memory blocks. In addition, the plurality of memory blocks may constitute a plurality of memory banks. The constituents constituting the memory cell array 360 may be arranged to have a layout shown in FIG. 2. The memory cell array 360 will later be described in more detail with reference to FIG. 2.

The I/O gating circuit 350 may include circuits for gating input/output data, write drivers for writing data in the memory cell array 360 and read latches for storing data read from the memory cell array 360.

The I/O buffer 380 may receive data DQ to be written in the memory cell array 360 from an external device (for example, memory controller (410 of FIG. 11)). The I/O buffer 380 may provide the data DQ to be written in the memory cell array 360 to the selected bit line BL of the memory cell array 360 through the write drivers. The data DQ read from the selected bit line BL of the memory cell array 360 is sensed by the sense amplifier 370 to then be stored in the read latches. The I/O buffer 380 may provide the data DQ stored in the read latches to the memory controller 410.

Although not shown clearly, the memory device may further include other constituents not illustrated herein.

FIG. 2 is a layout view of a memory cell array shown in FIG. 1 and FIG. 3 is a cross-sectional view of the semiconductor device shown in FIG. 1, taken along the line I-I' of FIG. 2.

Referring to FIGS. 2 and 3, the semiconductor device 1 according to the first embodiment of the present inventive concept includes two buried channel array transistors (BCATs) 120a and 120b in one unit active region 104. The unit active region 104 may be defined by a shallow trench isolation (STI) 105 in the substrate 100. The STI 105 may be formed to surround the unit active region 104.

In detail, the substrate 100 may have a structure in which a base substrate and an epitaxial layer are stacked, but aspects of the present inventive concept are not limited thereto. Here, the substrate 100 may be a silicon substrate, a gallium arsenide substrate, a silicon germanium, a ceramic substrate, a quartz substrate or a glass substrate for display. Alternatively, the substrate 100 may be a silicon on insulator (SOI) substrate. In the following description, the invention will be described with regard to a silicon substrate by way of example.

The unit active region 104 may extend in a first direction DR1 in the memory cell array (360 of FIG. 1). The first gate electrode (that is, the word line) 114 may extend in a second direction DR2 forming an acute angle with the first direction DR1 and the bit line 165 may extend in a third direction DR3 forming an acute angle with the first direction DR1.

Here, when it is said that "a particular direction and another particular direction form a predetermined angle," the term "angle" used herein means a smaller angle of two angles formed by two directions crossing each other, for example, 60° when angles formed by two directions cross each other are 114° and 60°. Thus, as shown in FIG. 2, the angle formed by the first direction DR1 and the second direction DR2 is θ1, and the angle formed by the first direction DR1 and the third direction DR3 is θ2.

As described above, the reason of θ1 and/or θ2 being acute angles is to obtain a maximum distance between a bit line contact 160 connecting the unit active region 104 to the bit line 165 and a storage node contact connecting the unit active region 104 to a capacitor (not shown). For example, θ1 and θ2 may be 45° and 45°, 30° and 60° or 60° and 30°, but not limited thereto.

A buried channel array transistor (BCAT) may be formed in the unit active region 104, but aspects of the present inventive concept are not limited thereto. The first buried transistor 120a or the second buried transistor 120b may be formed in the unit active region 104. The first buried transistor 120a may include a trench 110a, a gate insulation layer 112a, a gate electrode 114a, and a capping layer 116a.

The trench 110a may be formed in the substrate 100. The trench 110a may have various shapes. For example, the trench 110a may have a round shape in connection parts between its bottom surface and sidewalls, like in the illustrated embodiment. Alternatively, the trench 110a may be shaped such that its sidewall is tilted with a constant angle.

The gate insulation layer 112a may be conformally formed on the trench 110a. That is to say, the gate insulation layer 112a may be conformally formed along the sidewalls and bottom surface of the trench 110a. The gate insulation layer 112a may include at least one of a silicon oxide film, a silicon nitride film, a silicon oxynitride film and a high-k dielectric material. For example, the high-k material may include, but not limited to, $HfO_2$, $HfSiO_4$, $HfAlO$, $ZrO_2$, $ZrSiO_4$, $TaO_2$, $Ta_2O_5$, and $Al_2O_3$. Here, the gate insulation layer 112a may not be formed on a top surface of the substrate 100.

The gate electrode 114a may be formed on the gate insulation layer 112a. The gate electrode 114a may be formed in the trench 110a to fill at least a portion of the trench 110a without completely filling the trench 110a. The gate electrode 114a may include a conductive material including, for example, a metal, such as W, but aspects of the present inventive concept are not limited thereto.

The capping layer 116a may be formed on the gate electrode 114a to fill the trench 110a. The capping layer 116a may include, for example, an oxide film, a nitride film, an oxynitride film, and so on, but aspects of the present inventive concept are not limited thereto. The capping layer 116a may be formed to be coplanar with the top surface of the substrate 100.

The first source/drain region 101 and the second source/drain region 102 may be formed in the substrate 100 at opposite sides of the trench 110a. The first source/drain region 101 and the second source/drain region 102 may be doped with an N type impurity or a P type impurity.

The second buried transistor 120b may be formed in substantially the same manner with the first buried transistor 120a. The second buried transistor 120b may include a trench 110b, a gate insulation layer 112b, a gate electrode 114b, and a capping layer 116b.

The two gate electrodes 114a and 114b may be formed to intersect one unit active region 104. The unit active region 104 may include a first source/drain region 101 formed in the unit active region 104 between the two gate electrodes 114a and 114b, and a second source/drain region 102 and 103 formed at the opposite side of the first source/drain region 101 for each of the two gate electrodes 114a and 114b. The two buried transistors 120a and 120b share the first source/drain region 101 while not sharing the second source/drain region 102 and 103.

The first source/drain region 101 and the second source/drain region 102 and 103 may be formed so as to have a depth equal to or greater than a depth ranging from the substrate 100 to a top surface of each of the gate electrodes 114a and 114b.

When the first source/drain region 101 serves as a source, a drain is formed in a region of the second source/drain region 102 and 103. In this case, the depth ranging from the substrate 100 to the first source/drain region 101 may be greater than a depth from the substrate 100 to the second source/drain region 102 and 103. When the first source/drain region 101 serves as a drain, a source is formed in a region of the second source/drain region 102 and 103. In this case, the depth ranging from the substrate 100 to the second source/drain region 102 and 103 may also be greater than a depth from the substrate 100 to the first source/drain region 101.

The bit line contact 160 may be formed on the first source/drain region 101 and the storage node contacts 140a and 140b may be formed on the second sources/drains 102 and 103. That is to say, each of the storage node contacts 140a and 140b may be formed on the unit active region 104 positioned at one side of each of the buried transistors 120a and 120b.

Metal oxide layers 150a and 150b may be formed on the second sources/drains 102 and 103. The metal oxide layers 150a and 150b may be formed at lower portions of trenches 145a and 145b for forming the storage node contacts 140a and 140b. That is to say, the metal oxide layers 150a and 150b may be formed between each of the storage node contacts 140a and 140b and each of the second sources/drains 102 and 103. When the unit active region 104 is an N type active region, the metal oxide layers 150a and 150b may include $La_2O_3$. Alternatively, when the unit active region 104 is a P type active region, the metal oxide layers 150a and 150b may include $Al_2O_3$ or $TiO_2$.

The storage node contacts 140a and 140b may be metal contacts made of a metal. The storage node contacts 140a and 140b may include W, Ti or Ru.

The bit line contact 160 may be positioned between the first storage node contact 140a and the second storage node contact 140b. The first buried transistor 120a and the second buried transistor 120b may be positioned between the first storage node contact 140a and the second storage node contact 140b.

A first interlayer dielectric film 210a may be formed between the bit line contact 160 and the storage node contacts 140a and 140b. A bit line 165 may be formed on the first interlayer dielectric film 210a and the bit line contact 160. A second interlayer dielectric film 210b may be formed on the first interlayer dielectric film 210a and the bit line 165. The second interlayer dielectric film 210b may be formed such that it covers the bit line 165. The storage node contacts 140a and 140b may be formed such that they pass through the first interlayer dielectric film 210a and the second interlayer dielectric film 210b. The storage node contacts 140a and 140b may be formed to taper downwardly, but aspects of the present inventive concept are not limited thereto. That is to say, the storage node contacts 140a and 140b may be formed to have constant upper and lower widths. Top surfaces of the storage node contacts 140a and 140b and a top surface of the second interlayer dielectric film 210b may be coplanar.

A third interlayer dielectric film 210c may be formed on the second interlayer dielectric film 210b. Landing pads 170a and 170b may be formed such that they pass through the third interlayer dielectric film 210c. The landing pads 170a and 170b may be formed on the storage node contacts 140a and 140b to be electrically connected. The landing pads 170a and 170b may be formed to taper downwardly, but aspects of the present inventive concept are not limited thereto. That is to say, the landing pads 170a and 170b may be formed to have constant upper and lower widths.

Capacitors 180a and 180b may be formed on the landing pads 170a and 170b to be electrically connected thereto. A fourth interlayer dielectric film 210d may be formed such that it covers the capacitors 180a and 180b. The storage contacts 182a and 182b may be formed such that they pass through the fourth interlayer dielectric film 210d. The storage contacts 182a and 182b may be electrically connected to the capacitors 180a and 180b.

In the semiconductor device 1 according to the embodiment of the present inventive concept, the metal oxide layer 150 is formed between the storage node contact 140 as a metal contact and the unit active region 104. Various material films may be formed between the metal contact and the active region. In order to form an ohmic contact between the metal contact and the active region, a silicide layer has conventionally been formed. However, the silicide layer is formed up to the unit active region 104 in the course of forming the silicide layer. Thus, if a junction depth increases, a barrier height increases, that is, a threshold voltage increases, resulting in an increase in the leakage current. When a metal oxide layer, instead of a silicide layer, is used, resistances are reduced. Accordingly, the more the threshold voltage reduced, the more the leakage current may be reduced. Therefore, the ohmic contact may be formed between the metal contact and the unit active region using the metal oxide layer.

Figure 4A:
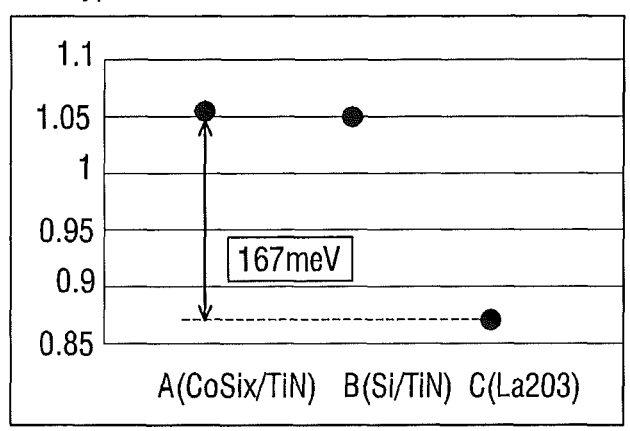
FIGS. 4A and 4B illustrate a threshold voltage of the semiconductor device shown in FIG. 1.
Figure 4B:
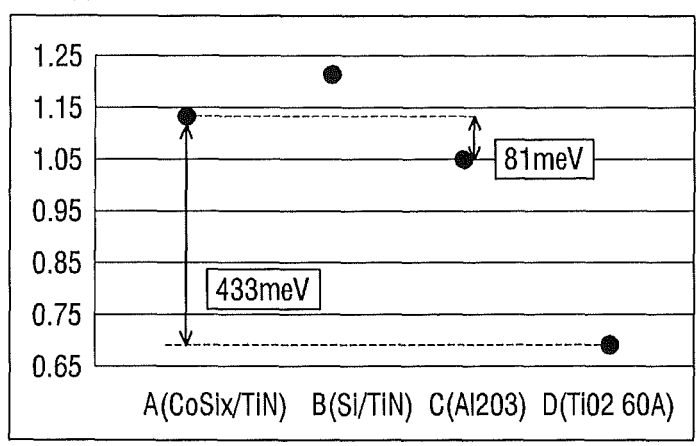

FIGS. 4A and 4B illustrate a threshold voltage of the semiconductor device shown in FIG. 1.

First, the table shown in FIG. 4A illustrates a graphical representation of threshold voltages measured from silicides (A and B) are formed between the storage node contact and unit active region shown in FIG. 3 and a metal oxide layer (C) is formed between the storage node contact and unit active region, Here, CoSix/TiN (A) and Si/TiN (B) are used as silicides, and $La_2O_3$ (C) is used as a metal oxide layer.

In experiments, a contact surface between the metal contact and the unit active region is cleaned using, for example, HF. Next, an interface oxide layer (IFO) is deposited to a thickness of approximately 5 Å. Next, when the unit active region is an N type, $La_2O_3$ is deposited to a thickness of approximately 10 Å, and when the unit active region is a P type, $Al_2O_3$ and $TiO_2$ are deposited. Then, a TiN or W metal contact is formed. In FIG. 4A, data is illustrated in a case when the unit active region is an N type.

When a case where the metal oxide layer is formed using $La_2O_3$ (C) is compared with a case where the silicide is formed using CoSix/TiN (A), the threshold voltage was reduced by approximately 167 meV. In addition, when the case where the metal oxide layer is formed using $La_2O_3$ (C) is compared with a case where silicide is formed using Si/TiN (B), the threshold voltage was reduced by approximately 160 meV. That is to say, as confirmed by the experimental result, $La_2O_3$ (C) has a relatively small threshold voltage, the leakage current is reduced.

Therefore, in the present embodiment, the metal oxide layer having a relatively small threshold voltage without increasing the junction depth can be formed using $La_2O_3$, thereby improving both of a current amount characteristic and a GIDL characteristic.

The table shown in FIG. 4B illustrates a graphical representation of threshold voltages measured in cases where silicides (A and B) are formed using and cases where metal oxide layers (C and D) are formed. In FIG. 4B, the experimental conditions are substantially the same as those of the experiment of FIG. 4A, except that the unit active region is a P type active region.

Here, CoSix/TiN (A) and Si/TiN (B) are used as silicides, and $Al_2O_3$ (C) and $TiO_2$ (D) are used as metal oxide layers.

When a case where the metal oxide layer is formed using $Al_2O_3$ (C) to a thickness of approximately 10 Å is compared with a case where silicide is formed using CoSix/TiN (A), the threshold voltage was reduced by approximately 81 meV. In addition, when a case where the metal oxide layer is formed using $TiO_2$ (D) to a thickness of approximately 60 Å is compared with a case where silicide is formed using Si/TiN (B), the threshold voltage was reduced by approximately 433 meV. That is to say, as confirmed by the experimental result, when $Al_2O_3$ (C) and $TiO_2$ (D) are used, the threshold voltage is relatively small, so that the leakage current is reduced.

When the metal oxide layer, instead of silicide, is formed, resistances are reduced. The leakage current can be reduced as much as the reduced threshold voltage. Therefore, the ohmic contact may be formed between the metal contact and the unit active region using the metal oxide layer.

Like in the previous embodiment, in the present embodiment, the metal oxide layer having a relatively small threshold voltage without increasing the junction depth can be formed using $Al_2O_3$ and $TiO_2$, thereby improving both of a current amount characteristic and a GIDL characteristic.

FIG. 5 is a cross-sectional view of a semiconductor device according to a second embodiment of the present inventive concept.

In the present embodiment that follows, repeated descriptions of the same matters as those of the previous embodiment will not be given and the following description will focus on differences between the previous and present embodiments.

Referring to FIG. 5, the semiconductor device 2 according to the second embodiment of the present inventive concept may include metal oxide layers 152a and 152b. The metal oxide layers 152a and 152b may be formed on second sources/drains 102 and 103. The metal oxide layers 152a and 152b may be conformally formed on trenches 145a and 145b for forming storage node contacts 140a and 140b. That is to say, the metal oxide layers 152a and 152b may be formed to surround opposite side surfaces of the storage node contacts 140a and 140b. The metal oxide layers 152a and 152b may be formed to make contact with the second sources/drains 102 and 103, a first interlayer dielectric film 210a and a second interlayer dielectric film 210b. When the unit active region 104 is an N type active region, the metal oxide layers 152a and 152b may include $La_2O_3$, and when the unit active region 104 is a P type active region, the metal oxide layers 152a and 152b may include $Al_2O_3$ or $TiO_2$.

Figure 6:
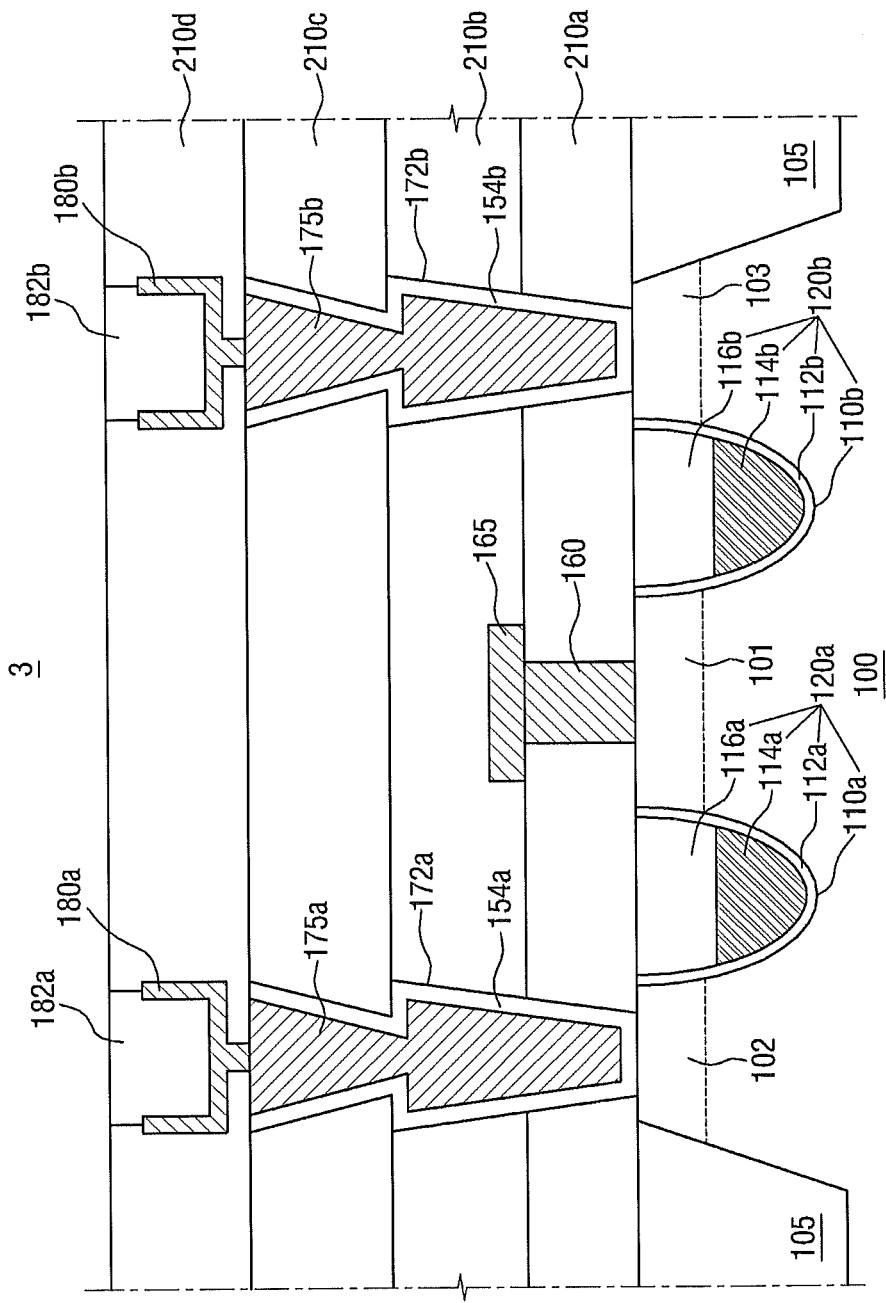
FIG. 6 is a cross-sectional view of a semiconductor device according to a third embodiment of the present inventive concept.

FIG. 6 is a cross-sectional view of a semiconductor device according to a third embodiment of the present inventive concept.

In the present embodiment that follows, repeated descriptions of the same matters as those of the previous embodiment will not be given and the following description will focus on differences between the previous and present embodiments.

Referring to FIG. 6, the semiconductor device 3 according to the third embodiment of the present inventive concept may include storage node contacts 175a and 175b and metal oxide layers 154a and 154b.

The storage node contacts 175a and 175b may correspond to the storage node contact 140 and the landing pad 170 shown in FIG. 3, which are integrally formed. The storage node contacts 175a and 175b may pass through first to third interlayer dielectric films 210a, 210b and 210c.

The metal oxide layers 154a and 154b may be formed on the second sources/drains 102 and 103. The metal oxide layers 154a and 154b may be conformally formed on the trenches 172a and 172b for forming the storage node contacts 175a and 175b. That is to say, the metal oxide layers 154a and 154b may be formed to surround opposite side surfaces of the storage node contacts 175a and 175b. The metal oxide layers 154a and 154b may be formed to make contact with the second sources/drains 102 and 103 and the first to third interlayer dielectric films 210a, 210b and 210c, When the unit active region 104 is an N type active region, the metal oxide layers 154a and 154b may include $La_2O_3$, and when the unit active region 104 is a P type active region, the metal oxide layers 154a and 154b may include $Al_2O_3$ or $TiO_2$.

Figure 7:
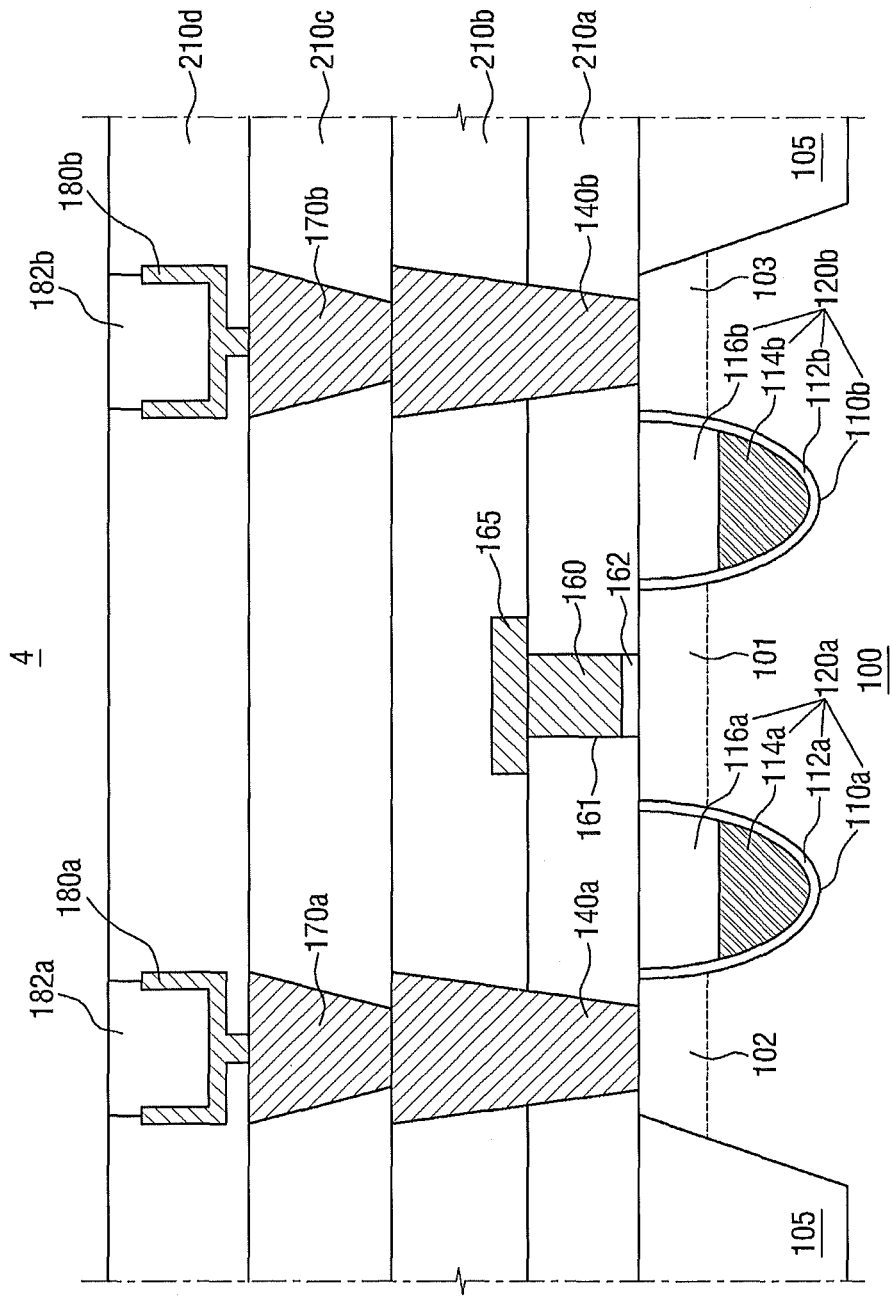
FIG. 7 is a cross-sectional view of a semiconductor device according to a fourth embodiment of the present inventive concept.

FIG. 7 is a cross-sectional view of a semiconductor device according to a fourth embodiment of the present inventive concept.

In the present embodiment that follows, repeated descriptions of the same matters as those of the previous embodiment will not be given and the following description will focus on differences between the previous and present embodiments.

Referring to FIG. 7, the semiconductor device 4 according to the fourth embodiment of the present inventive concept may include a metal oxide layer 162. The semiconductor device 4 may not include the metal oxide layers 150a and 150b of the semiconductor device 1 shown in FIG. 3.

The bit line contact 160 may be a metal contact made of a metal. The bit line contact 160 may include W, Ti or Ru.

The metal oxide layer 162 may be formed on the first source/drain region 101. The metal oxide layer 162 may be formed at a lower portion of a trench 161 for forming the bit line contact 160. That is to say, the metal oxide layer 162 may be formed between the bit line contact 160 and the first source/drain region 101. When the unit active region 104 is an N type active region, the metal oxide layer 162 may include $La_2O_3$ and when the unit active region 104 is a P type active region, the metal oxide layer 162 may include $Al_2O_3$ or $TiO_2$.

The semiconductor devices 2 to 4 described above with reference to FIGS. 5 to 10 may have substantially the same effects as the semiconductor device 1 according to the first embodiment shown in FIGS. 4A and 4B.

When a metal oxide layer, instead of a silicide layer, is used, resistances are reduced. Accordingly, the leakage current may be reduced as much as a reduced threshold voltage. Therefore, the ohmic contact may be formed between the metal contact and the unit active region using the metal oxide layer.

Figure 8:
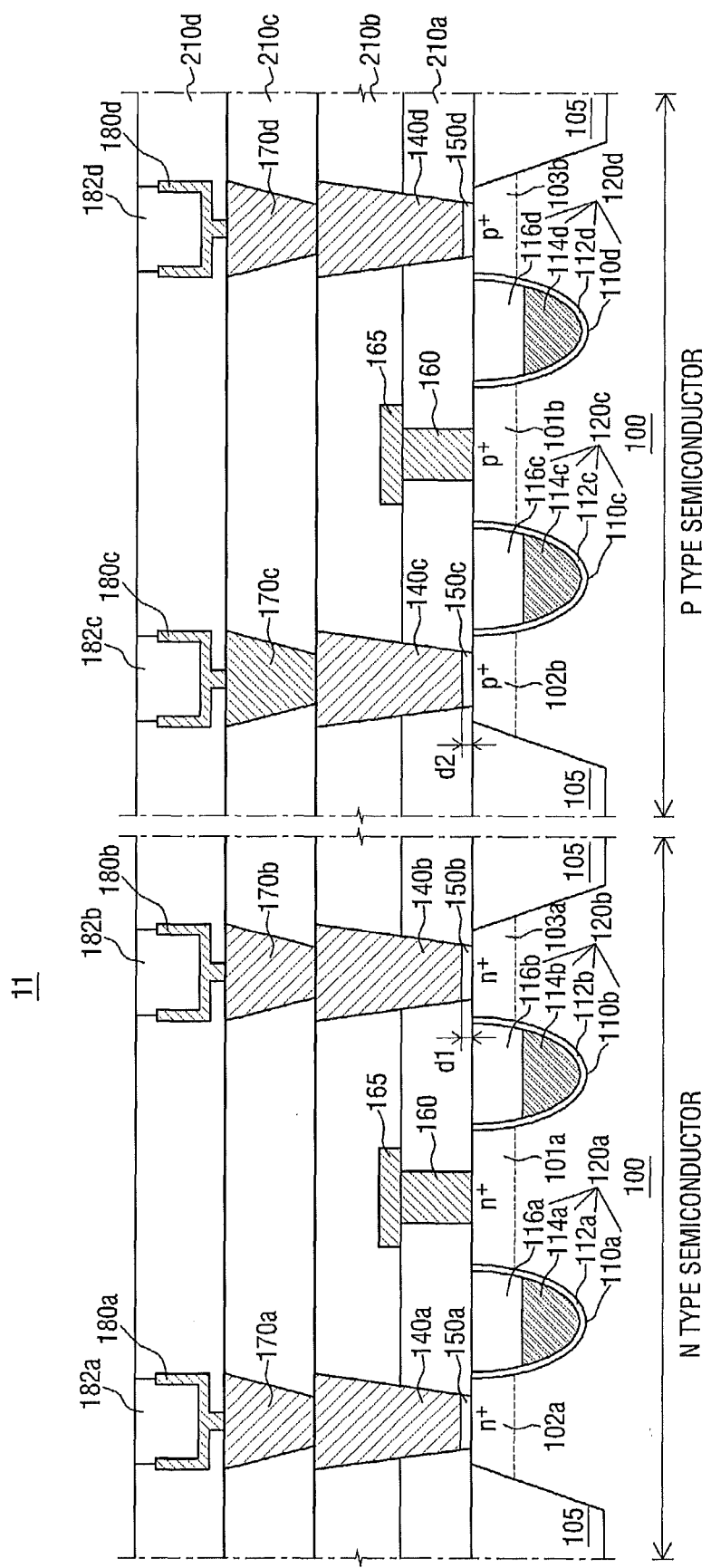
FIG. 8 is a cross-sectional view of a semiconductor device according to a fifth embodiment of the present inventive concept.

FIG. 8 is a cross-sectional view of a semiconductor device according to a fifth embodiment of the present inventive concept.

Referring to FIG. 8, the semiconductor device 11 according to the fifth embodiment of the present inventive concept may include an N type semiconductor device including an N type active region and a P type semiconductor device including a P type active region. The N type semiconductor device and the P type semiconductor device may be connected to each other to constitute a CMOS circuit.

The N type semiconductor device and the P type semiconductor device may operate in substantially the same manner as the constituents of the semiconductor device 1 shown in FIG. 3.

Buried transistor 120a, 120b, 120c and 120d may include first buried transistors 120a and 120b provided in the N type active region and second buried transistors 120c and 120d provided in the P type active region.

Storage node contacts 140a, 140b, 140c and 140d may include first storage node contacts 140a and 140b each formed on the N type active region positioned at one side of each of the first buried transistors 120a and 120b and second storage node contacts 140c and 140d each formed on the P type active region positioned at one side of each of the second buried transistors 120c and 120d.

Landing pads 170a, 170b, 170c and 170d may include first landing pad pads 170a and 170b formed on first storage node contacts 140a and 140b and second landing pad pads 170c and 170d formed on second storage node contacts 140c and 140d.

Capacitors 180a, 180b, 180c and 180d may include first capacitors 180a and 180b formed on the first landing pad pads 170a and 170b and electrically connected to the first active region and second capacitors 180c and 180d formed on the second landing pad pads 170c and 170d and electrically connected to the second active region.

Metal oxide layers 150a, 150b, 150c and 150d may include first metal oxide layers 150a and 150b formed between the first storage node contacts 140a and 140b and the N type active region and having a first thickness d1, and second metal oxide layers 150c and 150d formed between the second storage node contacts 140c and 140d and the P type active region and having a second thickness d2.

When the first metal oxide layers 150a and 150b include $La_2O_3$ and the second metal oxide layers 150c and 150d include $Al_2O_3$, the second thickness d2 may be equal to the first thickness d1. For example, the first thickness d1 and the second thickness d2 may equally be 1 nm or less, but aspects of the present inventive concept are not limited thereto.

Figure 9:
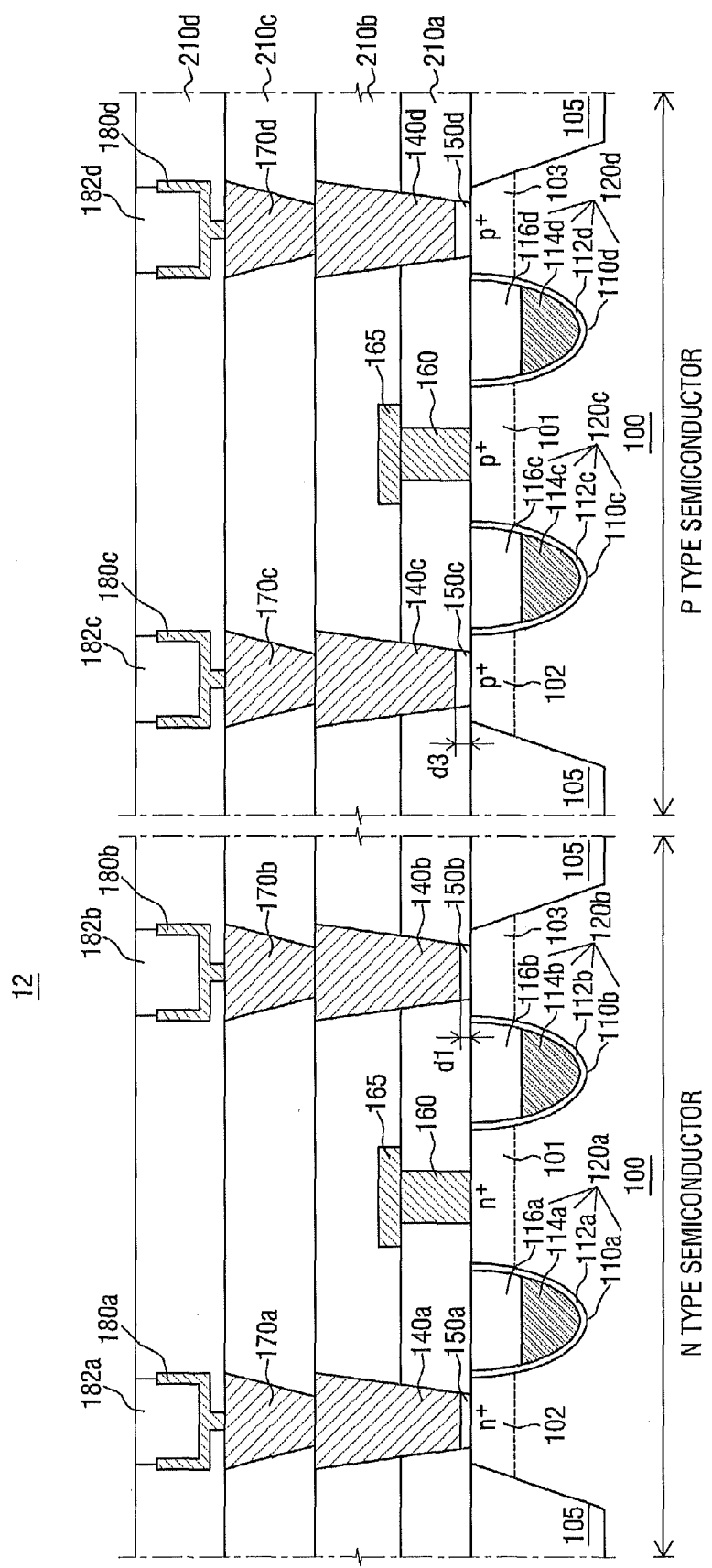
FIG. 9 is a cross-sectional view of a semiconductor device according to a sixth embodiment of the present inventive concept.

FIG. 9 is a cross-sectional view of a semiconductor device according to a sixth embodiment of the present inventive concept.

Referring to FIG. 9, the semiconductor device 12 according to the sixth embodiment of the present inventive concept may include an N type semiconductor device including an N type active region and a P type semiconductor device including a P type active region. The semiconductor device 12 may operate in substantially the same manner as the constituents of the semiconductor device 11 shown in FIG. 8. Therefore, for the sake of convenient explanation, the following description of the semiconductor device 12 will focus on differences from the semiconductor device 11 shown in FIG. 8.

Metal oxide layers 150a, 150b, 150c and 150d may include first metal oxide layers 150a and 150b formed between the first storage node contacts 140a and 140b and the N type active region and having a first thickness d1, and second metal oxide layers 150c and 150d formed between the second storage node contacts 140c and 140d and the P type active region and having a second thickness d3.

When the first metal oxide layers 150a and 150b include $La_2O_3$ and the second metal oxide layers 150c and 150d include $TiO_2$, the second thickness d3 may be greater than the first thickness d1. For example, the first thickness d1 may be 1 nm or less and the second thickness d3 may be 6 nm or less, but aspects of the present inventive concept are not limited thereto.

Figure 10:
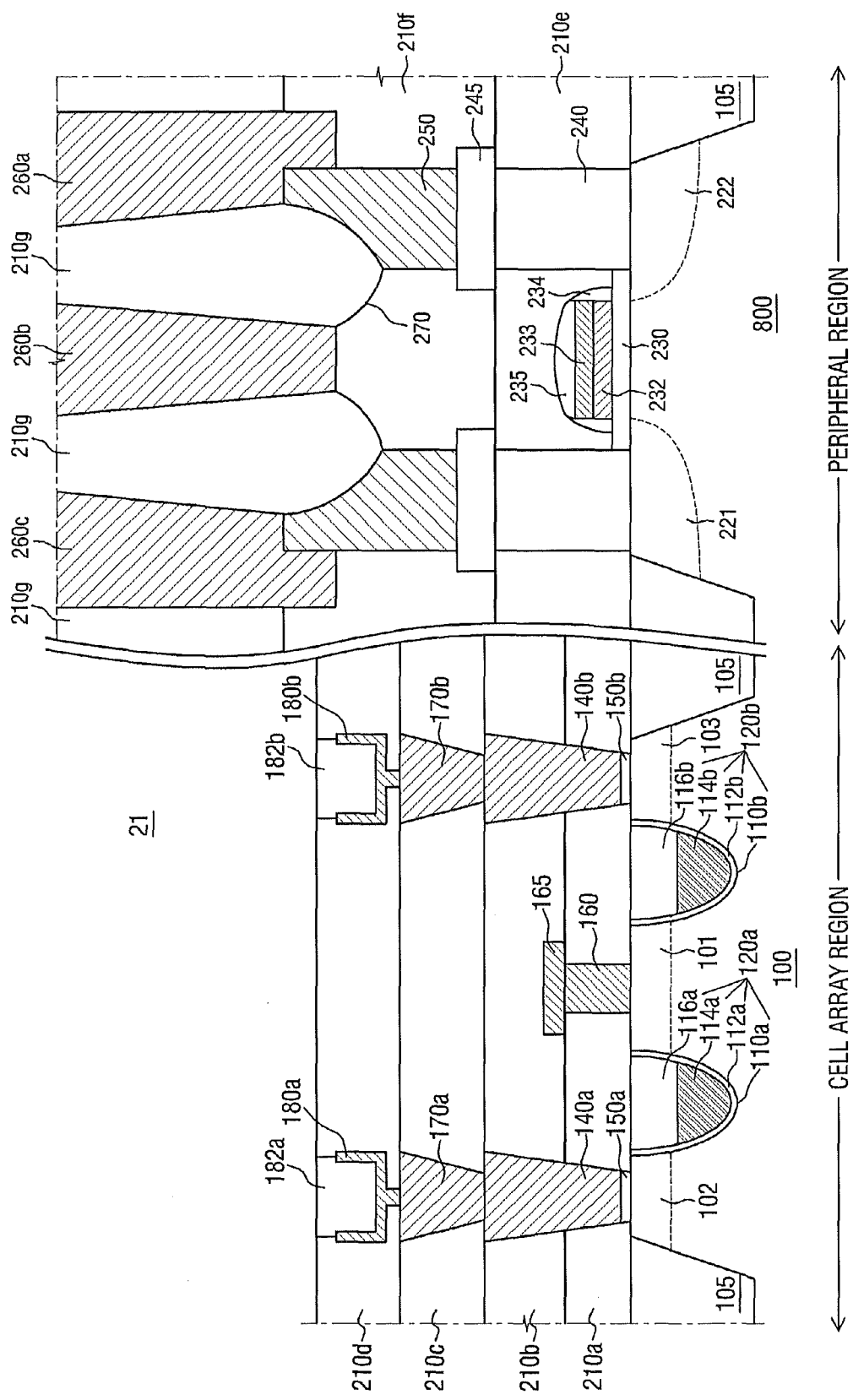
FIG. 10 is a cross-sectional view of a semiconductor device according to a seventh embodiment of the present inventive concept.

FIG. 10 is a cross-sectional view of a semiconductor device according to a seventh embodiment of the present inventive concept.

Referring to FIG. 10, the semiconductor device 21 according to the seventh embodiment of the present inventive concept may be a memory device. For example, the semiconductor device 21 may be a dynamic random access memory (DRAM). The DRAM may be divided into a cell array region in which memory devices are arranged, and core and peripheral region (to be referred to as a peripheral region hereinafter).

The semiconductor device 21 may have a device isolation layer 105 formed on a substrate 100 to define a cell array region and a peripheral region.

A memory device in a cell array region may operate in substantially the same manner as the constituents of the semiconductor device 1 shown in FIG. 3.

A plurality of buried transistors 120a and 120b may be formed in a first active region 700. The memory device in a cell array region may include buried transistors 120a and 120b, storage node contacts 140a and 140b, a bit line contact 160, a bit line 165, landing pads 170a and 170b, capacitors 180a and 180b, and storage contacts 182a and 182b.

A gate pattern may be formed in the peripheral region. A gate oxide layer 230, a first conductive layer 232, a second conductive layer 233, and an insulation layer 235 are sequentially formed on a second active region 800, and a gate spacer 234 may be formed on lateral surfaces of the gate pattern.

Third sources/drains 221 and 222 may be formed on the lateral surfaces of the gate pattern in the second active region 800, A fifth interlayer dielectric film 210e may be formed to cover the gate pattern and the third sources/drains 221 and 222. A bit line contact 240 may pass through the fifth interlayer dielectric film 210e to then be electrically connected to the third sources/drains 221 and 222, A bit line 245 may be formed on the bit line contact 240 and may be electrically connected to the bit line contact 240.

A sixth interlayer dielectric film 210f may be formed to cover the bit line 245 and the fifth interlayer dielectric film 210e. A first metal contact plug 250 may pass through the sixth interlayer dielectric film 210f, First interlayer interconnections 260a and 260c may be formed to overlap with a first metal contact plug 250, and a second interlayer interconnection 260b may be formed not to overlap with the first metal contact plug 250. A first trench 270 may be formed on the first metal contact plug 250 and the sixth interlayer dielectric film 210f. A seventh interlayer dielectric film 210g may be formed by filling the first trench 270.

FIG. 11 is a block diagram of a memory system including the semiconductor device shown in FIG. 1.

Referring to FIG. 11, the memory system 400 may include a memory device 420 including a memory controller 410 and a semiconductor device 1.

The memory controller 410 is configured to control the memory device 420. The memory controller 410 may access the memory device 420 in response to a request from a host. For example, the memory controller 410 may write data in the memory device 420 or may read data from the memory device 420, To this end, the memory controller 410 may supply a command CMD, an address ADDR, etc. to the memory device 420 and may exchange data DQ with the memory device 420. The memory controller 410 may be configured to drive firmware for controlling the memory device 420.

The memory device 420 may be configured to store data. In an exemplary embodiment, the memory device 420 may be a dynamic random access memory (DRAM), such as a double data rate synchronous dynamic random access memory (DDR SDRAM), a single data rate synchronous dynamic random access memory (SDR SDRAM), a low power double data rate (LPDDR) SDRAM, a direct rambus DRAM (RDRAM), or an arbitrary volatile memory device. The memory device 420 may be configured in substantially the same manner as the memory device shown in FIG. 1.

Figure 12:
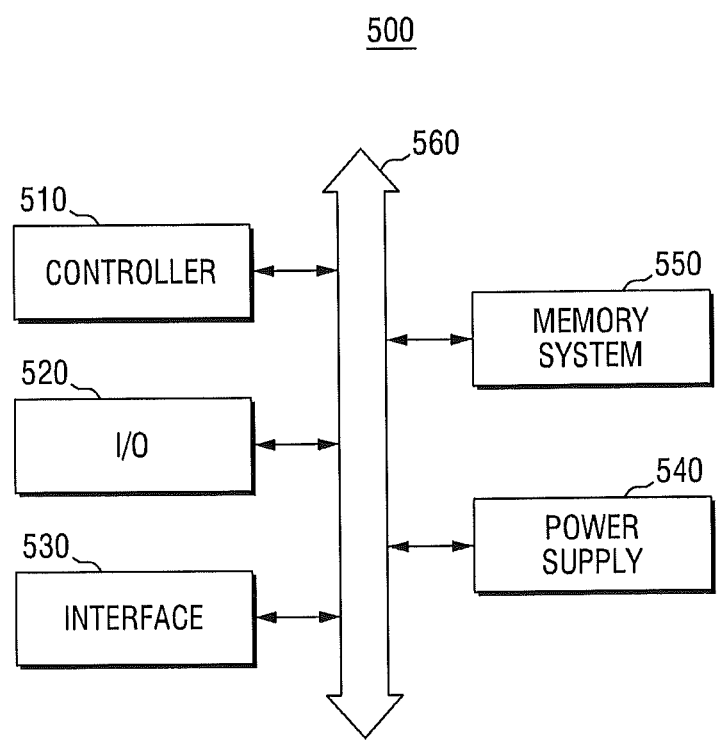
FIG. 12 is a block diagram of a computing system including memory systems according to some embodiments of the present inventive concept.

FIG. 12 is a block diagram of a computing system including memory systems according to some embodiments of the present inventive concept.

Referring to FIG. 12, the computing system 500 may include a controller 510, an input/output device (I/O) 520, an interface 530, a power supply 540 and a memory system 550.

The controller 510, the I/O 520, the interface 530, the power supply 540 and the memory system 550 may be connected to each other through a bus 560. The bus 560 corresponds to a path through which data moves.

The controller 510 may include at least one of a microprocessor, a digital signal processor, a microcontroller, and logic elements capable of functions similar to those of these elements.

The I/O 520 may include one or more input device, such as a keypad, a touch screen, or the like, and/or a display device, such as a speaker, a display device, or the like.

The interface 530 may perform functions of transmitting data to a communication network or receiving data from an external device. For example, the interface 530 may perform Ethernet communication, near field communication (NFC), radio frequency identification (RFID) communication, mobile telecommunication, memory card communication, or universal serial bus (USB) communication.

The power supply 540 may convert externally input power to then supply the converted power to various components 510 to 550.

The memory system 550 may store data processed by the controller 510 or may operate as a working memory of the controller 510. The memory system 550 may operate in substantially the same manner as the constituents of the memory system 400 shown in FIG. 11.

Although not shown clearly, the computing system 500 may further include a direct memory access (DMA) controller for controlling data input/output. The DMA controller may transfer data between the memory system 550 and various kinds of devices.

In addition, the computing system 500 may further include a nonvolatile memory device storing a boot image. As an example, the nonvolatile memory device may be one of a variety of nonvolatile memory devices, such as a read-only memory (ROM), a programmable read-only memory (PROM), an electrically erasable programmable read-only memory (EEPROM), a flash memory, a phase change random access memory (PRAM), a resistance random access memory (RRAM), or a ferroelectric random access memory (FRAM).

In an embodiment of the present inventive concept, the computing system 500 may be an arbitrary computing system, such as a mobile phone, a smart phone, a personal digital assistant (PDA), a portable multimedia player (PMP), a digital camera, a music player, a portable game console, a navigation system, or the like.

Figure 13:
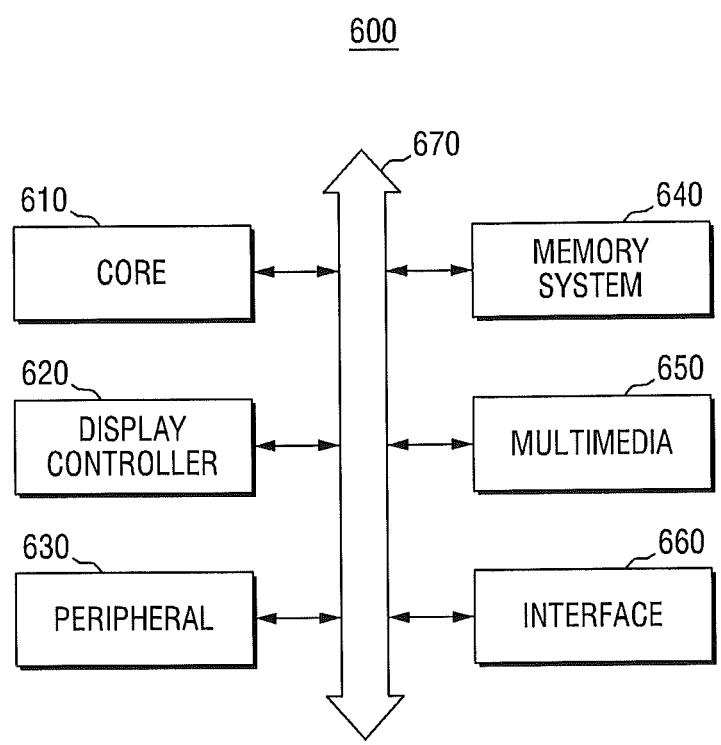
FIG. 13 is a block diagram of an exemplary system on chip including memory systems according to some embodiments of the present inventive concept.

FIG. 13 is a block diagram of an exemplary system on chip including memory systems according to some embodiments of the present inventive concept.

Referring to FIG. 13, the system on chip 600 may include a core device 610, a display controller 620, a peripheral device 630, a memory system 640, a multimedia device 650, an interface 660 and a data bus 670.

The core device 610, the display controller 620, the peripheral device 630, the memory system 640, the multimedia device 650, and the interface 660 may be connected to each other through the data bus 670. The bus 670 may correspond to a path along which data moves.

The core device 610 may include a single core or a multi-core having multiple processor cores to process data. As an example, the core device 610 may include a multi-core, such as a dual-core, a quad-core, a hexa-core, or the like.

The display controller 620 controls a display device to control the display device to display a picture or an image.

The peripheral device 630 may include a serial communication device, a memory management device, an audio processor, and so on.

The memory system 640 may be configured to store data. The memory system 640 may include one or more volatile memory system, such as a double data rate static random access memory (DDR SDRAM), a single data rate static random access memory, and/or one or more nonvolatile memory system, such as an electrically erasable programmable read-only memory (EEPROM), a flash memory, or the like.

The volatile memory system may be configured in substantially the same manner as the memory system 400 shown in FIG. 11.

The multimedia device 650 includes a graphic engine, an image signal processor (ISP), a codec engine, etc. and may process multimedia operations.

The interface 660 may perform functions of transmitting data to a communication network or receiving data from an external device.

Figure 14:
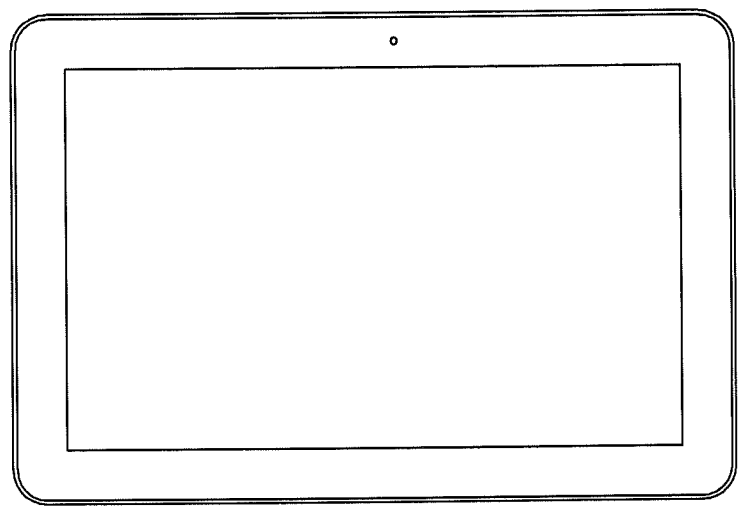
FIGS. 14 and 15 illustrate exemplary semiconductor systems to which semiconductor devices according to some embodiments of the present inventive concept can be applied.
Figure 15:
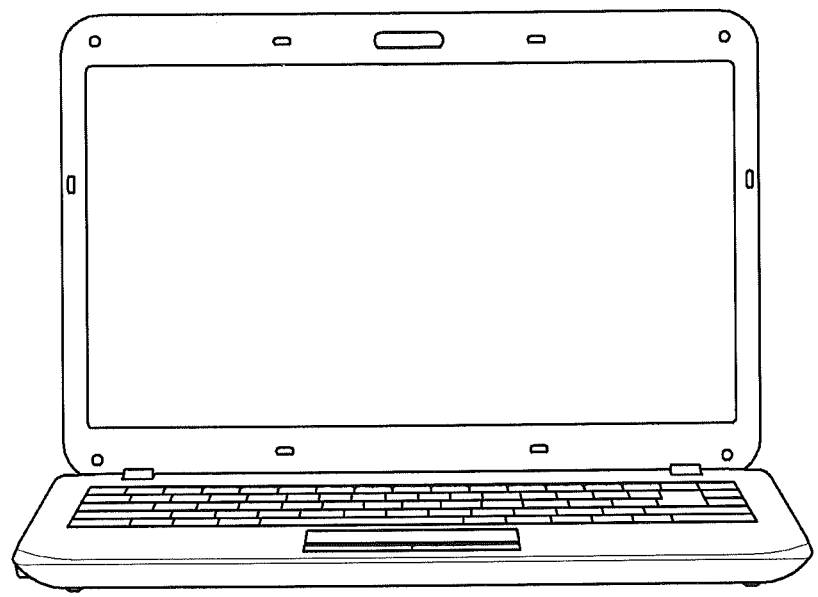

FIGS. 14 and 15 illustrate exemplary semiconductor systems to which semiconductor devices 1 to 4, 11, 12 and 21 according to some embodiments of the present inventive concept can be applied.

In detail, FIG. 14 illustrates an example in which a semiconductor device according to an embodiment of the present inventive concept is applied to a tablet PC 1200, and FIG. 15 illustrates an example in which a semiconductor device according to an embodiment of the present inventive concept is applied to a notebook computer 1300. It is obvious to one skilled in the art that at least one the semiconductor devices 1 to 4, 11, 12 and 21 according to some embodiments of the present inventive concept may be applied to the tablet PC 1200, the notebook computer 1300, and the like.

In addition, it is obvious to one skilled in the art that the semiconductor devices according to some embodiments of the present inventive concept may also be applied to other IC devices not illustrated herein. That is to say, in the illustrated-embodiments, the tablet PC 1200 and the notebook computer 1300 are exemplified as the semiconductor systems of the present embodiment, but aspects of the present inventive concept are not limited thereto.

In some embodiments of the present inventive concept, the semiconductor system may be implemented as a computer, an ultra mobile personal computer (UMPC), a work station, a net-book, a personal digital assistant (PDA), a portable computer, a wireless phone, a mobile phone, an e-book, a portable multimedia player (PMP), a potable game console, a navigation device, a black box, a digital camera, a 3-dimensional television, a digital audio recorder, a digital audio player, a digital picture recorder, a digital picture player, digital video recorder, a digital video player, and so on.

FIGS. 16 to 21 illustrate intermediate process steps for explaining a fabricating method of the semiconductor device according to the first embodiment of the present inventive concept.

Figure 16:
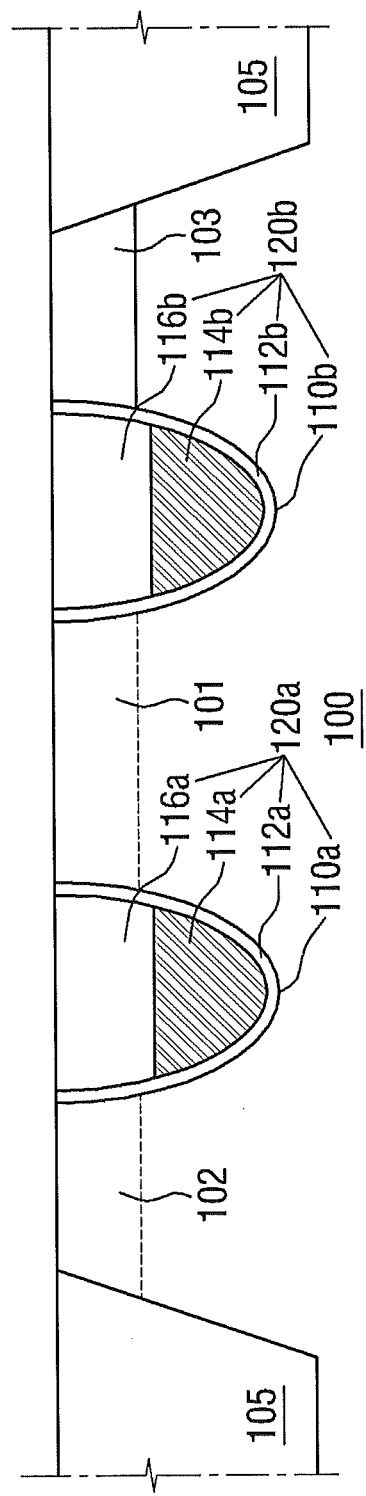
FIGS. 16 to 21 illustrate intermediate process steps for explaining a fabricating method of the semiconductor device according to the first embodiment of the present inventive concept.

Referring to FIG. 16, a unit active region 104 defined as a shallow trench isolation (STI) 105 is formed on a substrate 100. Next, trenches 110a and 110b are formed in the substrate 100. For example, a mask pattern is formed on the substrate 100 by photolithography. The mask pattern exposes a region of the substrate 100 where the trenches 110a and 110b are to be formed. The mask pattern may include an oxide film, a nitride film, an oxynitride film, and so on. The trenches 110a and 110b are formed by dry etching the region of the substrate 100 exposed by the mask pattern, but aspects of the present inventive concept are not limited thereto.

Although not shown clearly, before forming the mask pattern, impurity regions for sources/drain regions may be formed in the substrate 100. Alternatively, after forming the gate electrodes 114a and 114b, sources/drain regions may further be formed.

Next, gate insulation films 112a and 112b are conformally formed on the substrate 100 having the trenches 110a and 110b. The gate insulation films 112a and 112b may be formed along bottom surfaces and sidewalls of the trenches 110a and 110b. The gate insulation films 112a and 112b may be formed using at least one of silicon oxide, silicon nitride, silicon oxynitride and a high-k material. For example, the high-k material may include, but not limited, to, at least one of $HfO_2$, $HfSiO_4$, HfAlO, $ZrO_2$, $ZrSiO_4$, $TaO_2$, $Ta_2O_5$, and $Al_2O_3$. For example, the gate insulation films 112a and 112b may be formed by chemical vapor deposition (CVD) or atomic layer deposition (ALD).

Next, gate electrodes 114a and 114b, filling portions of the trenches 110a and 110b, are formed on the gate insulation films 112a and 112b. The gate electrodes 114a and 114b may be formed using a conductive material, for example, a metal such as tungsten (W).

Next, capping layers 116a and 116b, filling the trenches 110a and 110b, are formed on the gate electrodes 114a and 114b and the gate insulation films 112a and 112b. The capping layers 116a and 116b may be formed using an oxide film, a nitride film, an oxynitride film, and so on.

Next, the capping layers 116a and 116b and the gate insulation films 112a and 112b formed on the substrate 100 are removed to expose a top surface of the substrate 100. Portions of the capping layers 116a and 116b and the gate insulation films 112a and 112b may be removed by, for example, planarization.

Figure 17:
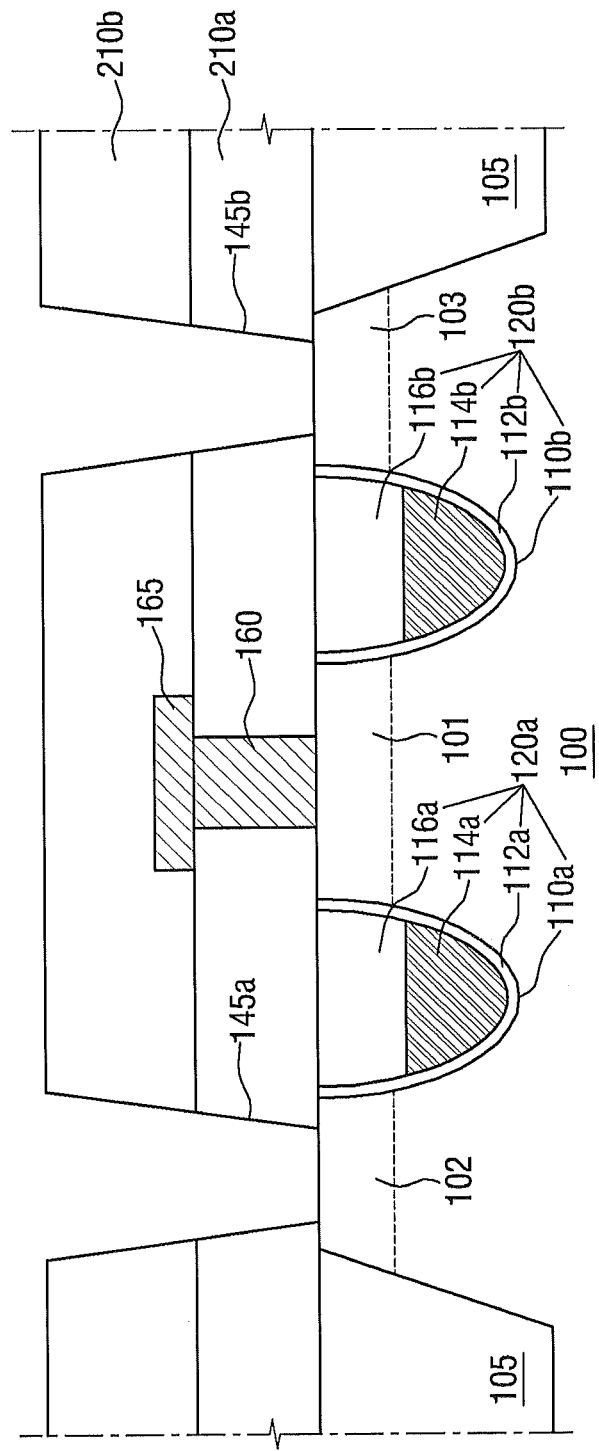

Next, referring to FIG. 17, a first interlayer dielectric film 210a is formed on the unit active region 104. Next, a bit line contact 160 passing through the first interlayer dielectric film 210a is formed on the first source/drain region 101. Next, a bit line 165 is formed on the bit line contact 160 and the first interlayer dielectric film 210a. Next, a second interlayer dielectric film 210b, covering the bit line 165 and the first interlayer dielectric film 210a, is formed. Then, trenches 145a and 145b, passing through the first interlayer dielectric film 210a and the second interlayer dielectric film 210b, are formed. The trenches 145a and 145b may expose second sources/drains 102 and 103 of the unit active region 104. The trenches 145a and 145b may be formed to taper downwardly, but aspects of the present inventive concept are not limited thereto. The trenches 145a and 145b may be formed to have constant upper and lower widths.

Figure 18:
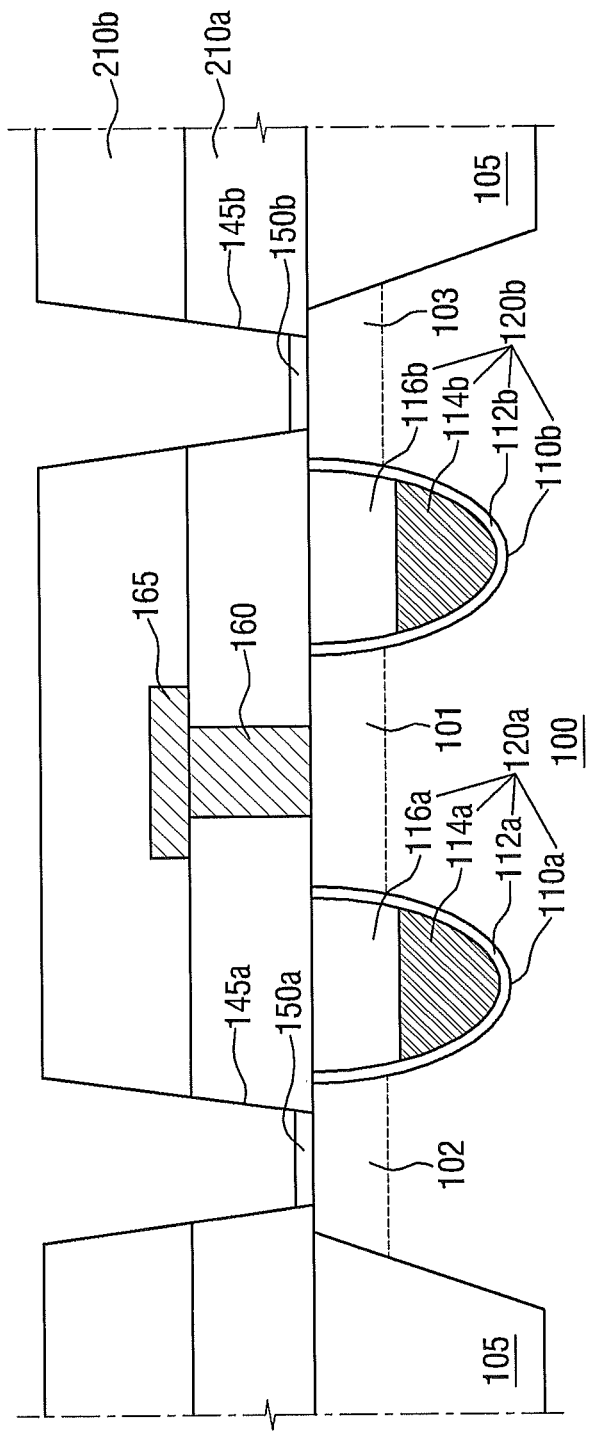

Next, referring to FIG. 18, metal oxide layers 150a and 150b are formed on the second sources/drains 102 and 103. That is to say, the metal oxide layers 150a and 150b are formed at lower portions of the trenches 145a and 145b. The metal oxide layers 150a and 150b may be formed by depositing a metal on the unit active region 104 by physical vapor deposition (PVD) and oxidizing the metal under an oxygen atmosphere, but aspects of the present inventive concept are not limited thereto.

Figure 19:
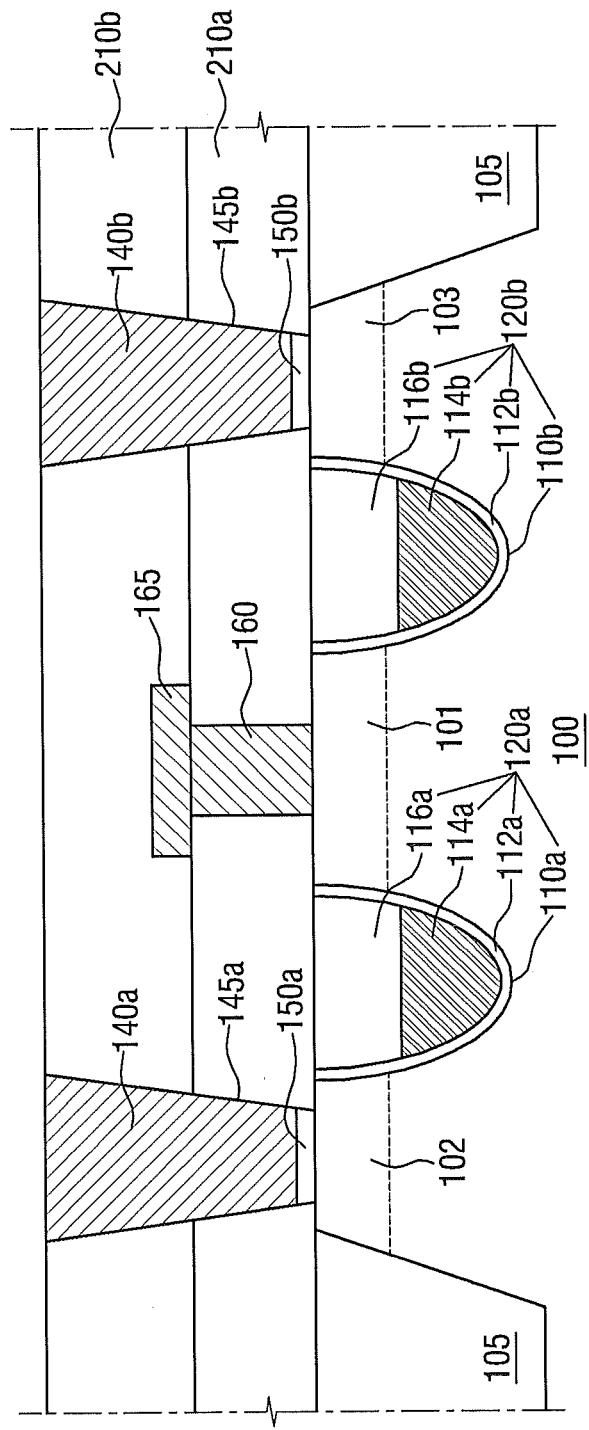

Next, referring to FIG. 19, storage node contacts 140a and 140b, filling the trenches 145a and 145b, are formed. Next, the storage node contacts 140a and 140b are removed to make top portions of the storage node contacts 140a and 140b positioned to be coplanar with a top portion of the second interlayer dielectric film 210b. Portions of the storage node contacts 140a and 140b may be removed by, for example, planarization, but aspects of the present inventive concept are not limited thereto.

Figure 20:
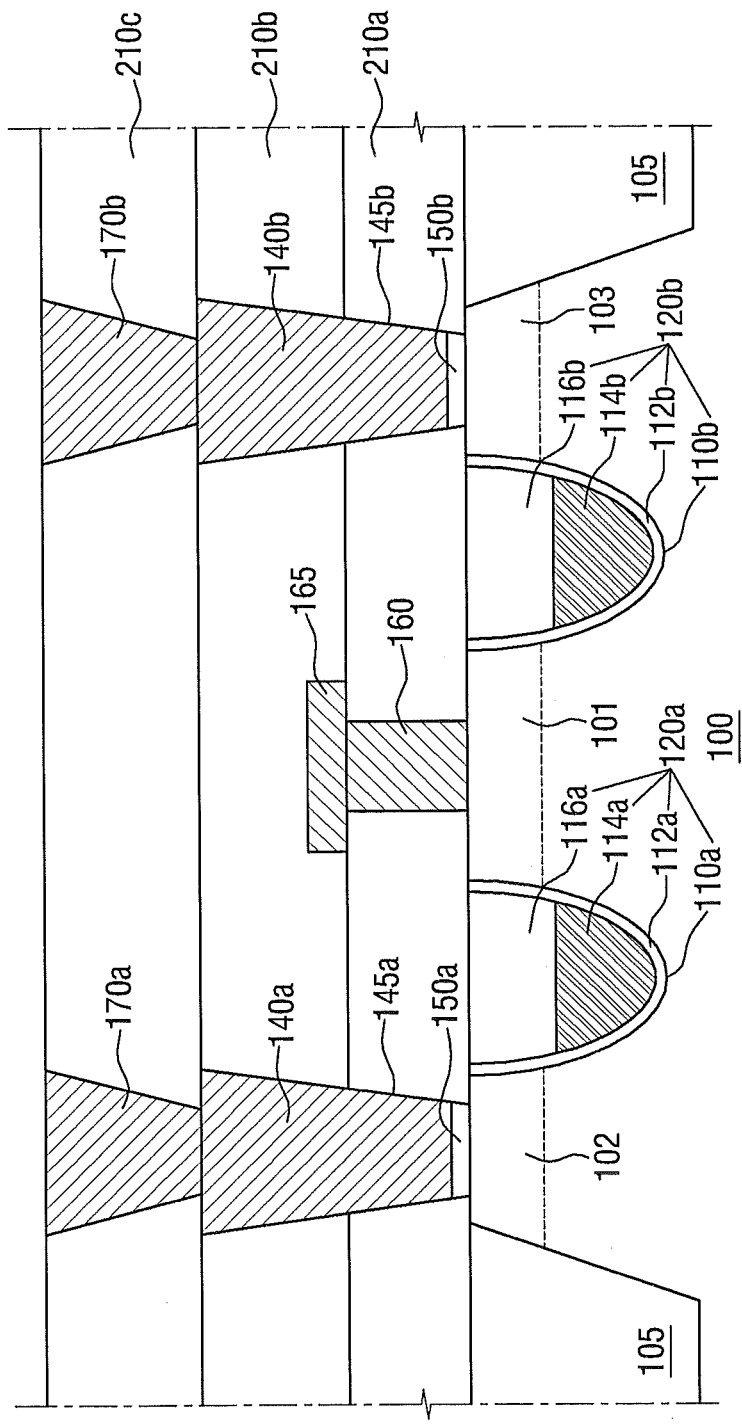

Next, referring to FIG. 20, a third interlayer dielectric film 210c, covering the storage node contacts 140a and 140b and the second interlayer dielectric film 210b, is formed. Then, landing pads 170a and 170b passing through the second interlayer dielectric film 210b are formed. The landing pads 170a and 170b may be positioned on the storage node contacts 140a and 140b. Next, the landing pads 170a and 170b are removed to be positioned to be coplanar with the third interlayer dielectric film 210c. Portions of the landing pads 170a and 170b may be removed by, for example, planarization.

Figure 21:
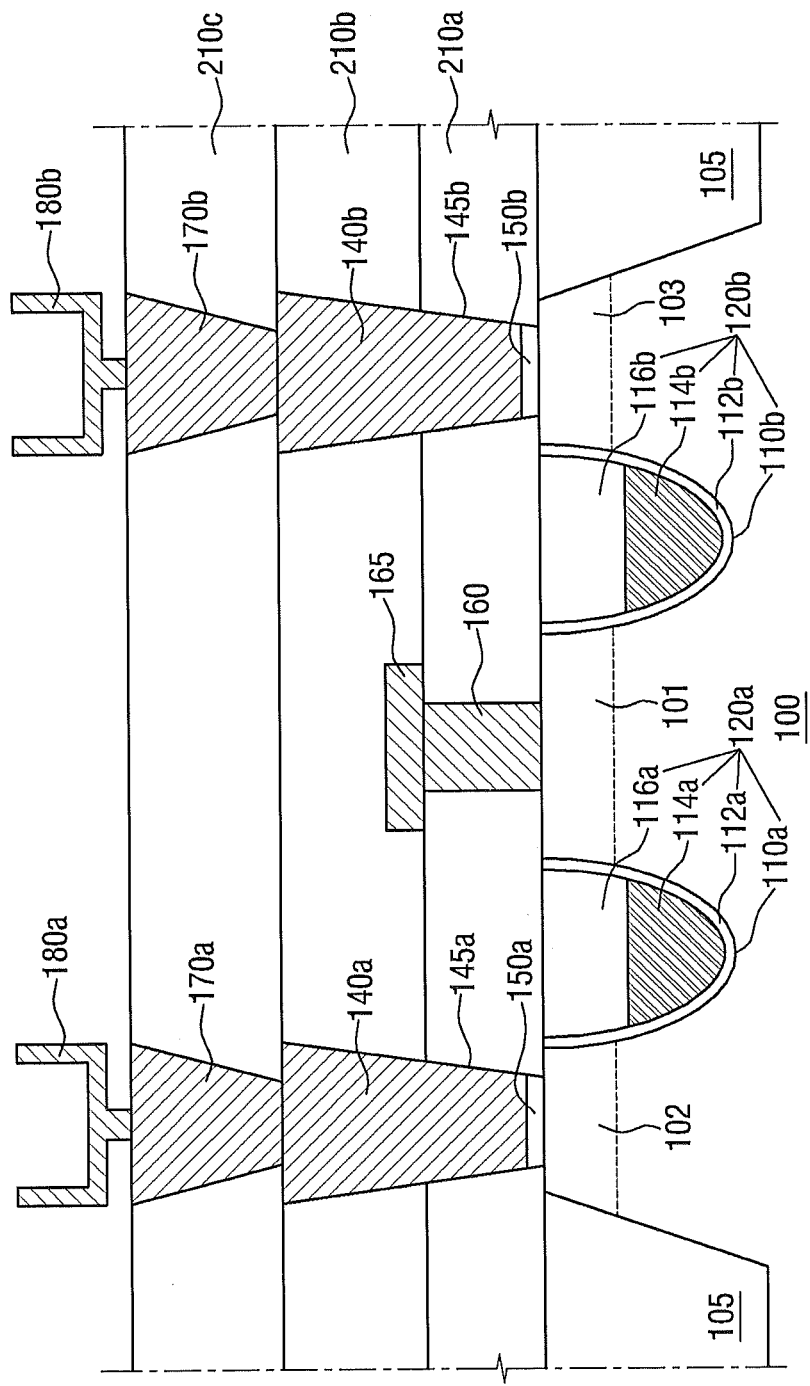

Next, referring to FIG. 21, capacitors 180a and 180b are formed on the landing pads 170a and 170b. The capacitors 180a and 180b may be electrically connected to the landing pads 170a and 170b.

Next, referring again to FIG. 3, a fourth interlayer dielectric film 210d may be formed to cover the capacitors 180a and 180b. The storage contacts 182a and 182b may be formed to pass through the fourth interlayer dielectric film 210d. The storage contacts 182a and 182b may be electrically connected to the capacitors 180a and 180b.

Figure 22:
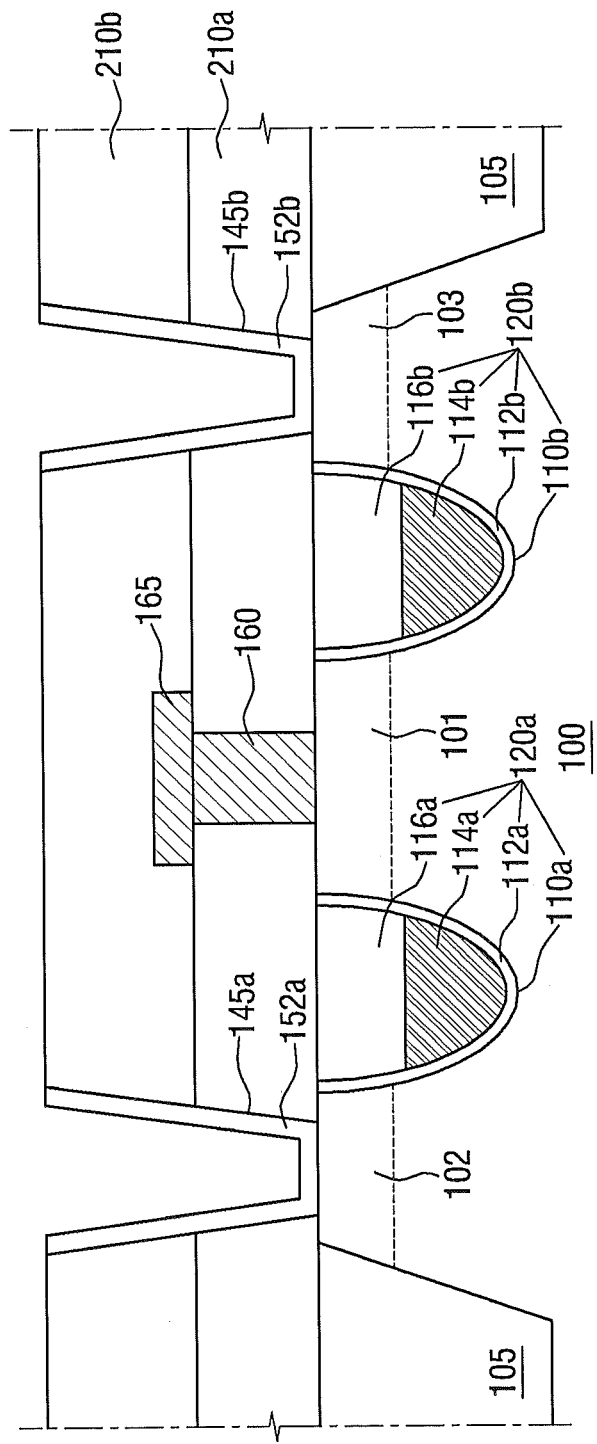
FIGS. 22 and 23 illustrate intermediate process steps for explaining a fabricating method of the semiconductor device according to the second embodiment of the present inventive concept.
Figure 23:
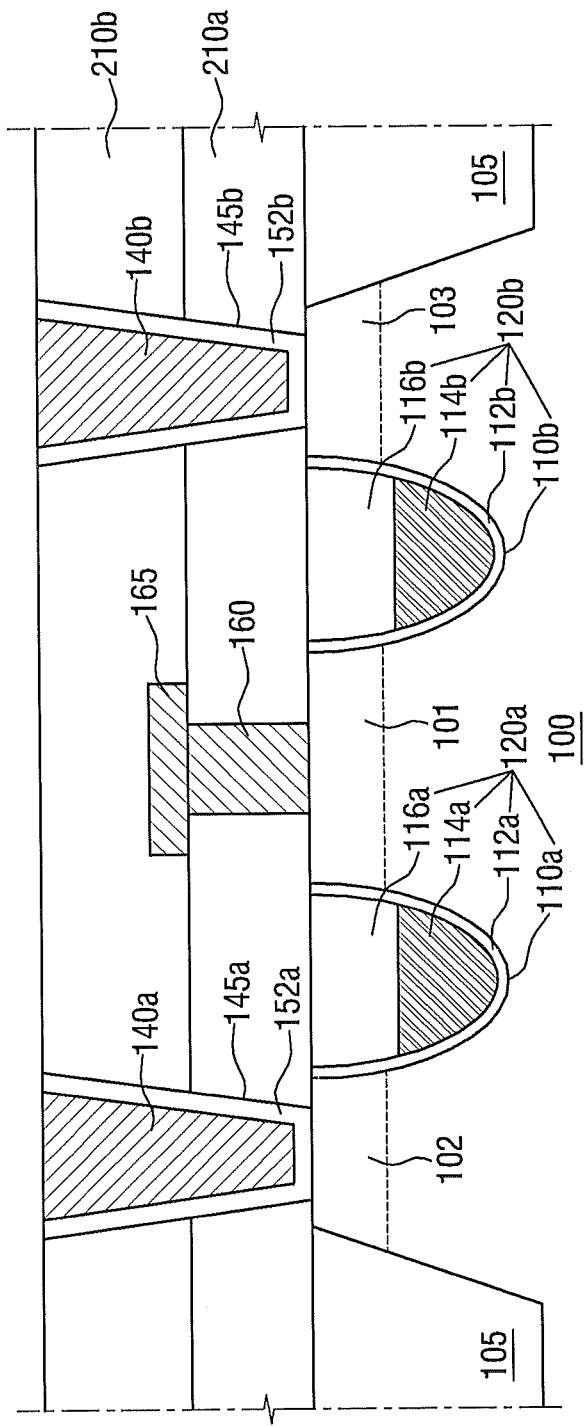

FIGS. 22 and 23 illustrate intermediate process steps for explaining a fabricating method of the semiconductor device according to the second embodiment of the present inventive concept.

The fabricating method of the semiconductor device 2 according to the second embodiment of the present inventive concept is similar to that of the semiconductor device 1. Therefore, for the sake of convenient explanation, the following description of the fabricating method of the semiconductor device 2 will focus on differences from that of the semiconductor device 1.

Referring to FIG. 22, the fabricating method of the semiconductor device 2 according to the second embodiment of the present inventive concept includes forming metal oxide layers 152a and 152b on the second sources/drains 102 and 103, after performing the process step shown in FIG. 17. The metal oxide layers 152a and 152b may be deposited on the unit active region 104 by atomic layer deposition (ALD) or chemical vapor deposition (CVD), but aspects of the present inventive concept are not limited thereto. The metal oxide layers 152a and 152b may be conformally formed on the trenches 145a and 145b for forming storage node contacts 140a and 140b. When the unit active region 104 is an N type active region, the metal oxide layers 152a and 152b may include $La_2O_3$, and when the unit active region 104 is a P type active region, the metal oxide layers 152a and 152b may include $Al_2O_3$ or $TiO_2$.

Next, referring to FIG. 23, storage node contacts 140a and 140b filling the trenches 145a and 145b are formed. That is to say, the metal oxide layers 152a and 152b may be formed to surround opposite side surfaces of the storage node contacts 140a and 140b. Next, the storage node contacts 140a and 140b are removed to make the storage node contacts 140a and 140b positioned to be coplanar with the second interlayer dielectric film 210b. Portions of the storage node contacts 140a and 140b may be removed by, for example, planarization, but aspects of the present inventive concept are not limited thereto. Subsequent process steps are the same as those of the fabricating method of the semiconductor device 1 shown in FIGS. 20 and 21.

Figure 24:
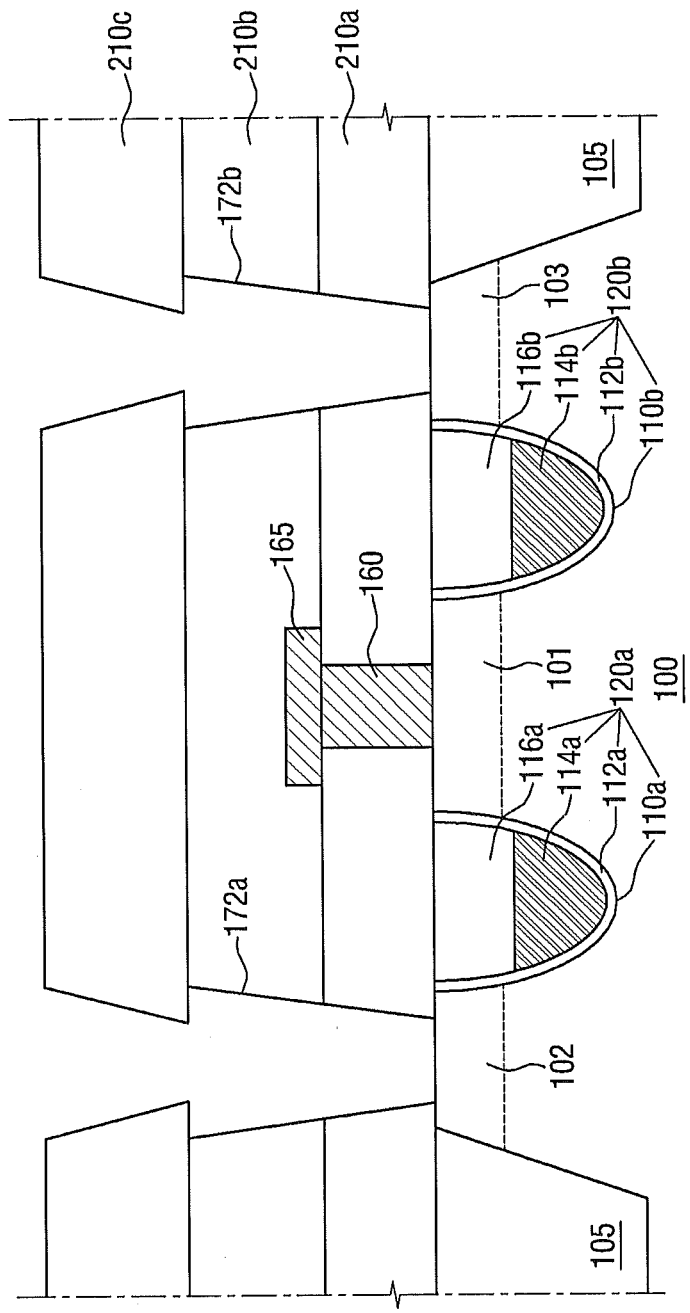
FIGS. 24 to 26 illustrate intermediate process steps for explaining a fabricating method of the semiconductor device according to the third embodiment of the present inventive concept.
Figure 25:
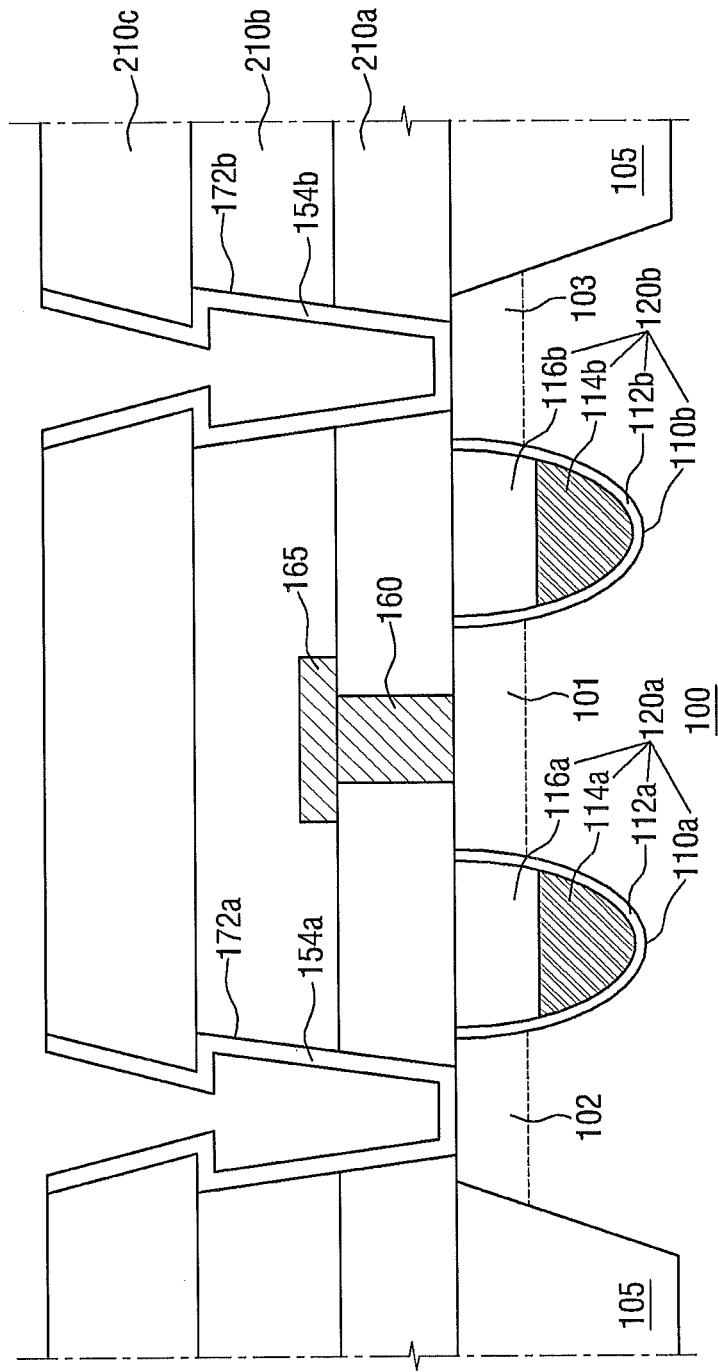
Figure 26:
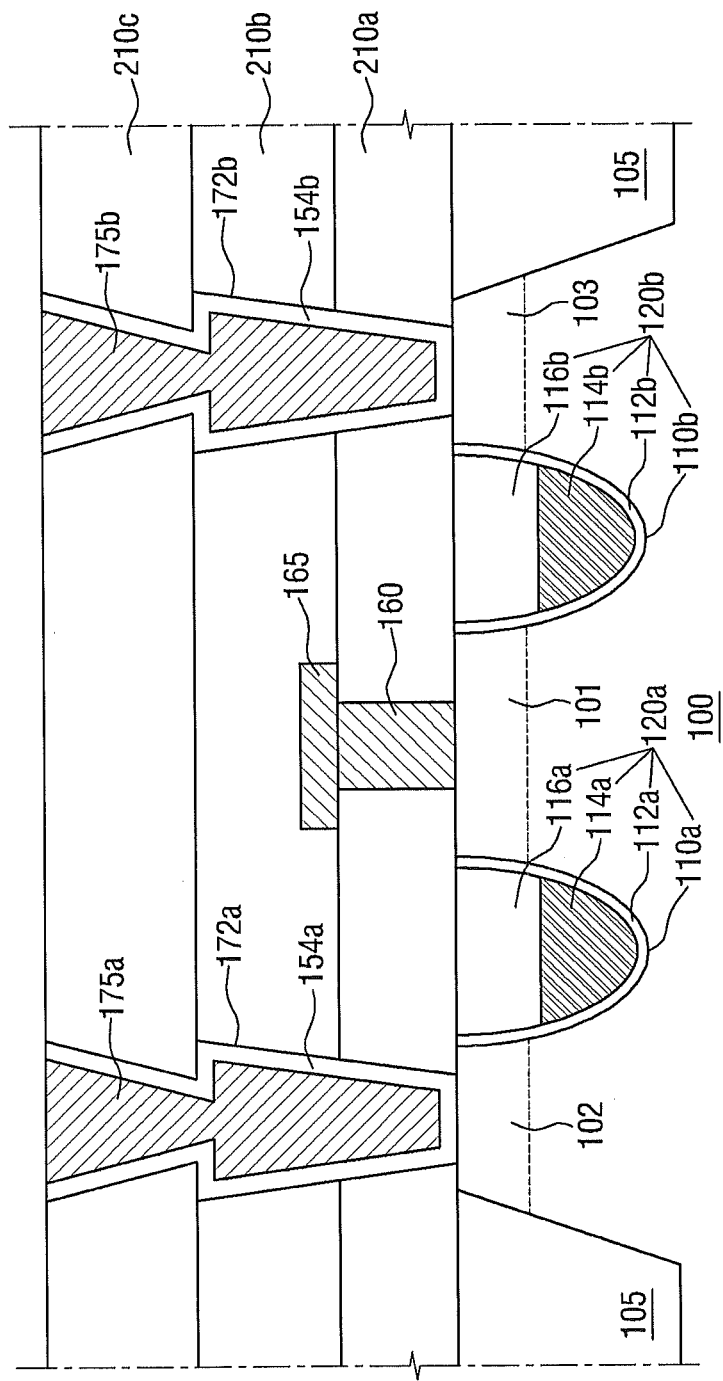

FIGS. 24 to 26 illustrate intermediate process steps for explaining a fabricating method of the semiconductor device according to the third embodiment of the present inventive concept.

The fabricating method of the semiconductor device 3 according to the third embodiment of the present inventive concept is similar to that of the semiconductor device 1. Therefore, for the sake of convenient explanation, the following description of the fabricating method of the semiconductor device 3 will focus on differences from that of the semiconductor device 1.

Referring to FIG. 24, the fabricating method of the semiconductor device 3 according to the third embodiment of the present inventive concept includes forming a third interlayer dielectric film 210c covering a second interlayer dielectric film 210b, after performing the process step shown in FIG. 17. Next, trenches 172a and 172b passing through first to third interlayer dielectric films 210a, 210b and 210c.

Next, referring to FIG. 25, metal oxide layers 154a and 154b are formed on second sources/drains 102 and 103. The metal oxide layers 154a and 154b may be deposited on the unit active region 104 by atomic layer deposition (ALD) or chemical vapor deposition (CVD), but aspects of the present inventive concept are not limited thereto. The metal oxide layers 154a and 154b may be conformally formed on the trenches 172a and 172b for forming storage node contacts 140a and 140b. That is to say, the metal oxide layers 154a and 154b may be formed to make contact with second sources/drains 102 and 103 and first to third interlayer dielectric films 210a, 210b and 210c. When the unit active region 104 is an N type active region, the metal oxide layers 154a and 154b may include $La_2O_3$, and when the unit active region 104 is a P type active region, the metal oxide layers 154a and 154b may include $Al_2O_3$ or $TiO_2$.

Next, referring to FIG. 26, storage node contacts 175a and 175b filling the trenches 172a and 172b are formed. That is to say, the metal oxide layers 154a and 154b may be formed to surround opposite side surfaces of the storage node contacts 175a and 175b. Next, the storage node contacts 175a and 175b are removed to make the storage node contacts 175a and 175b positioned to be coplanar with a third interlayer dielectric film 210c, Portions of the storage node contacts 175a and 175b may be removed by, for example, planarization, but aspects of the present inventive concept are not limited thereto. Subsequent process steps are the same as those of the fabricating method of the semiconductor device 1 shown in FIGS. 20 and 21.

FIGS. 27 to 31 illustrate intermediate process steps for explaining a fabricating method of the semiconductor device according to the fourth embodiment of the present inventive concept.

The fabricating method of the semiconductor device 4 according to the fourth embodiment of the present inventive concept is similar to that of the semiconductor device 1. Therefore, for the sake of convenient explanation, the following description of the fabricating method of the semiconductor device 4 will focus on differences from that of the semiconductor device 1.

Figure 27:
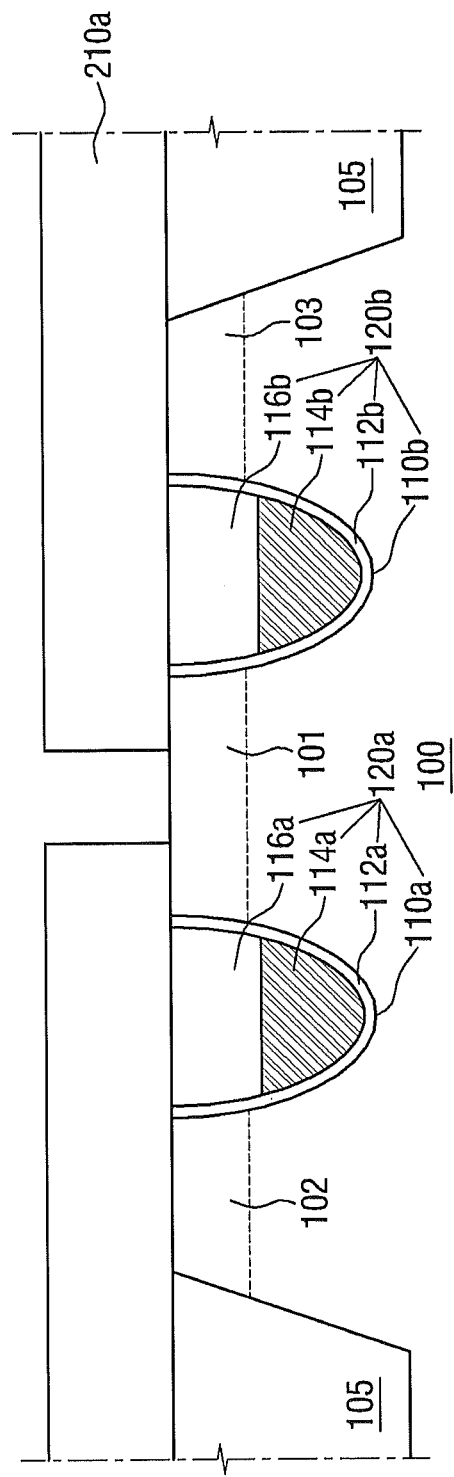
FIGS. 27 to 31 illustrate intermediate process steps for explaining a fabricating method of the semiconductor device according to the fourth embodiment of the present inventive concept.

Referring to FIG. 27, the fabricating method of the semiconductor device 4 according to the fourth embodiment of the present inventive concept includes forming a first interlayer dielectric film 210a on a unit active region 104, after performing the process step shown in FIG. 16. Next, a bit line contact 160 passing through the first interlayer dielectric film 210a is formed on a first source/drain region 101.

Figure 28:
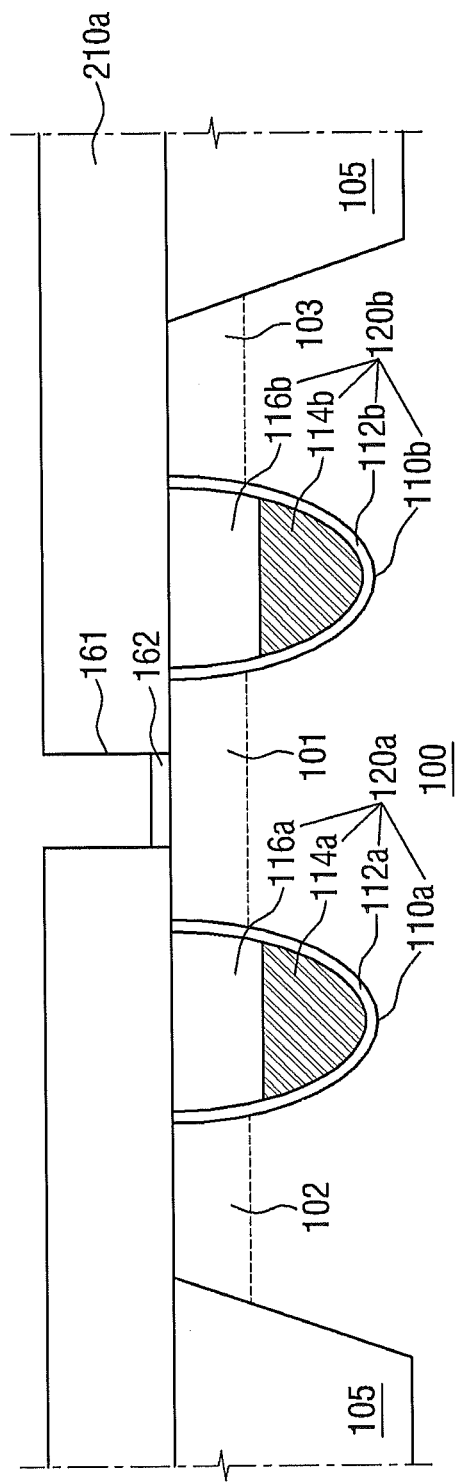

Next, referring to FIG. 28, a metal oxide layer 162 is formed on a first source/drain region 101. That is to say, the metal oxide layer 162 is formed at a lower portion of a trench 161. The metal oxide layer 162 may be formed by depositing a metal on the unit active region 104 by PVD and oxidizing the metal under an oxygen atmosphere, but aspects of the present inventive concept are not limited thereto. When the unit active region 104 is an N type active region, the metal oxide layer 162 may include $La_2O_3$, and when the unit active region 104 is a P type active region, the metal oxide layer 162 may include $Al_2O_3$ or $TiO_2$.

Figure 29:
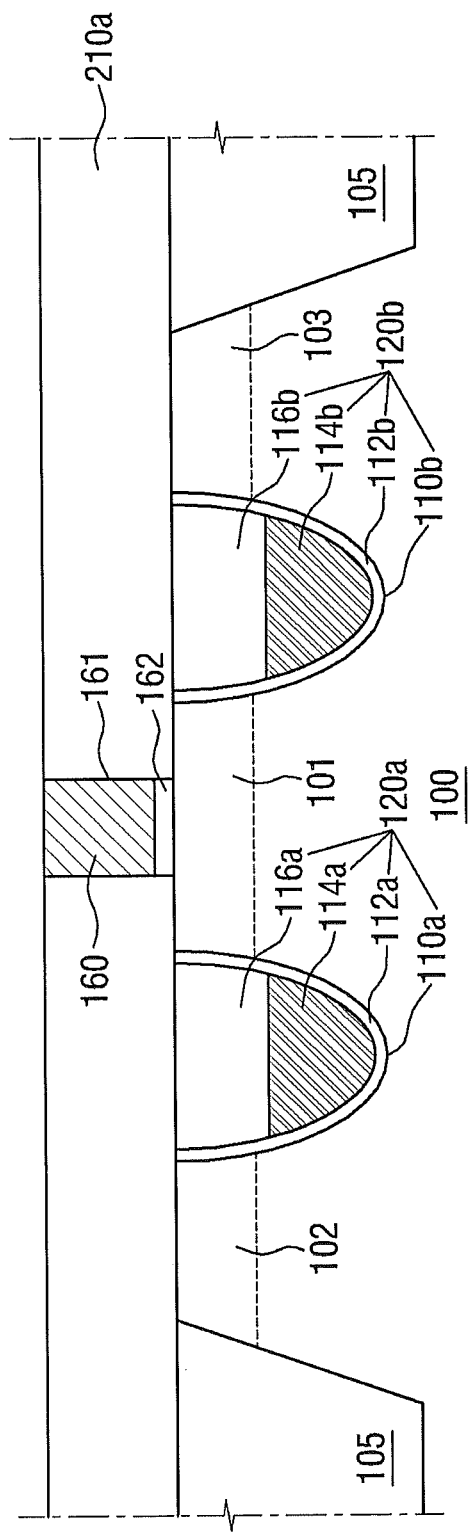

Next, referring to FIG. 29, a bit line contact 160 filling a trench 161 is formed. The bit line contact 160 may be a metal contact made of a metal. The bit line contact 160 may include W, Ti or Ru. Next, the bit line contact 160 is removed to make the bit line contact 160 positioned to be coplanar with a second interlayer dielectric film 210b. A portion of the bit line contact 160 may be removed by, for example, planarization, but aspects of the present inventive concept are not limited thereto.

Figure 30:
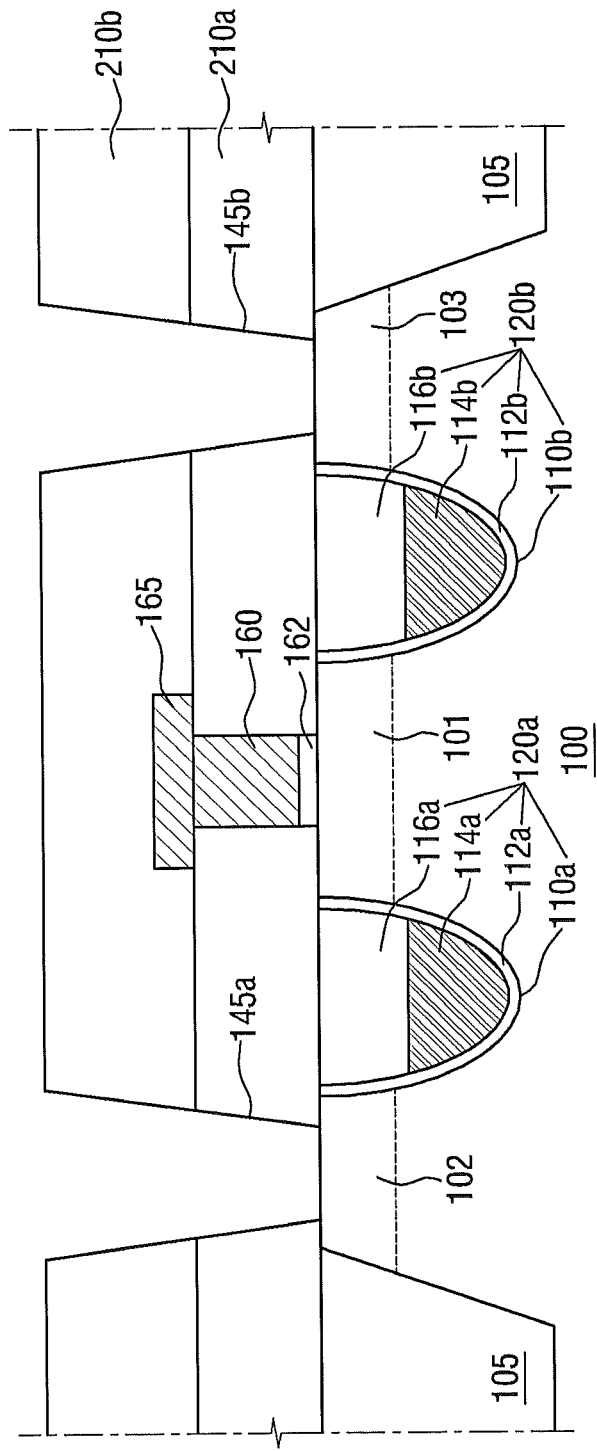

Next, referring to FIG. 30, a bit line 165 is formed on the bit line contact 160 and the first interlayer dielectric film 210a. Next, a second interlayer dielectric film 210b, covering the bit line 165 and the first interlayer dielectric film 210a, is formed. Then, trenches 142a and 142b, passing through the first interlayer dielectric film 210a and the second interlayer dielectric film 210b, are formed. The trenches 145a and 145b may expose second sources/drains 102 and 103 of the unit active region 104. The trenches 145a and 145b may be formed to taper downwardly, but aspects of the present inventive concept are not limited thereto. That is to say, the trenches 145a and 145b may be formed to have constant upper and lower widths.

Figure 31:
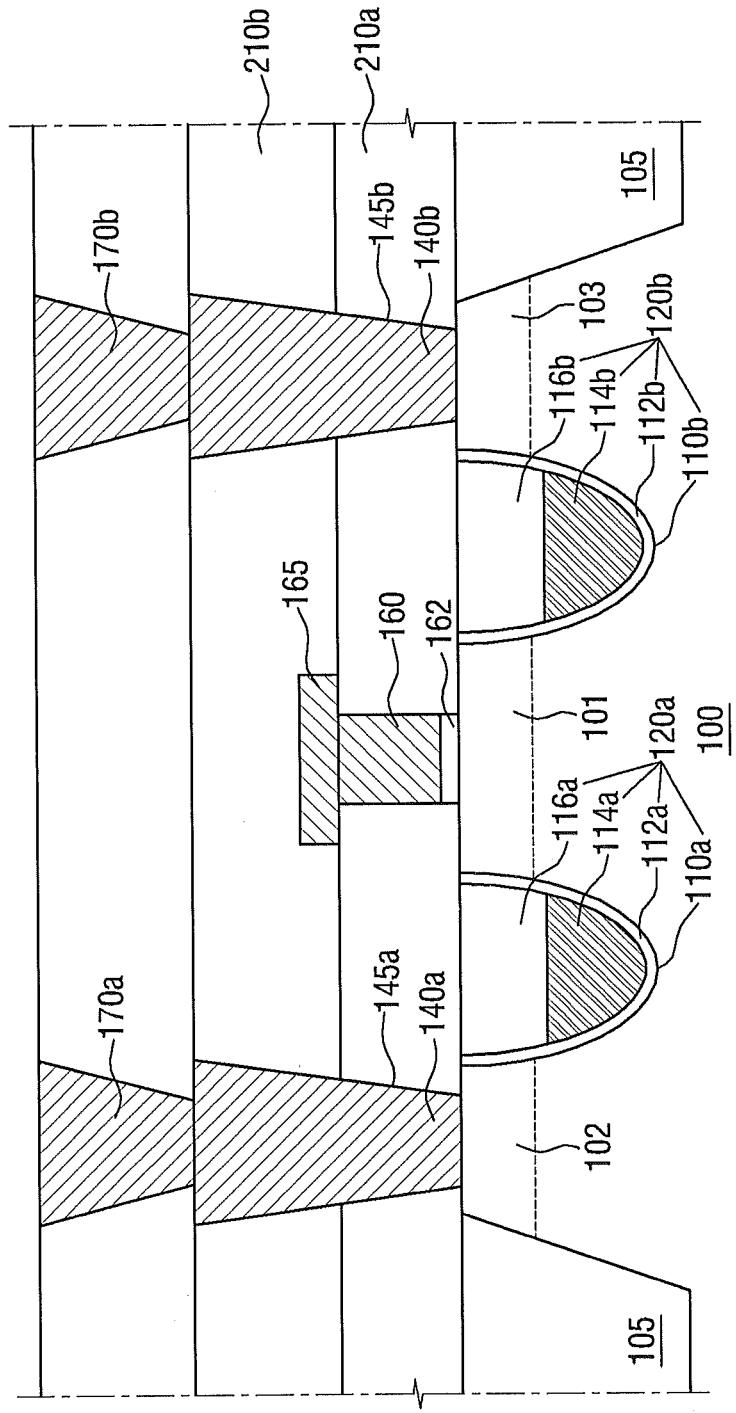

Next, referring to FIG. 31, storage node contacts 140a and 140b filling the trenches 145a and 145b are formed. Next, the storage node contacts 140a and 140b are removed to make the storage node contacts 140a and 140b positioned to be coplanar with the second interlayer dielectric film 210b. Next, a third interlayer dielectric film 210c, covering the storage node contacts 140a and 140b and the second interlayer dielectric film 210b, is formed. Then, landing pads 170a and 170b passing through the third interlayer dielectric film 210c are formed. The landing pads 170a and 170b may be positioned on the storage node contacts 140a and 140b. Next, the landing pads 170a and 170b are removed to be positioned to be coplanar with the third interlayer dielectric film 210c. Portions of the landing pads 170a and 170b may be removed by, for example, planarization. Subsequent process steps are the same as those of the fabricating method of the semiconductor device 1 shown in FIGS. 21 and 3.

Figure 32:
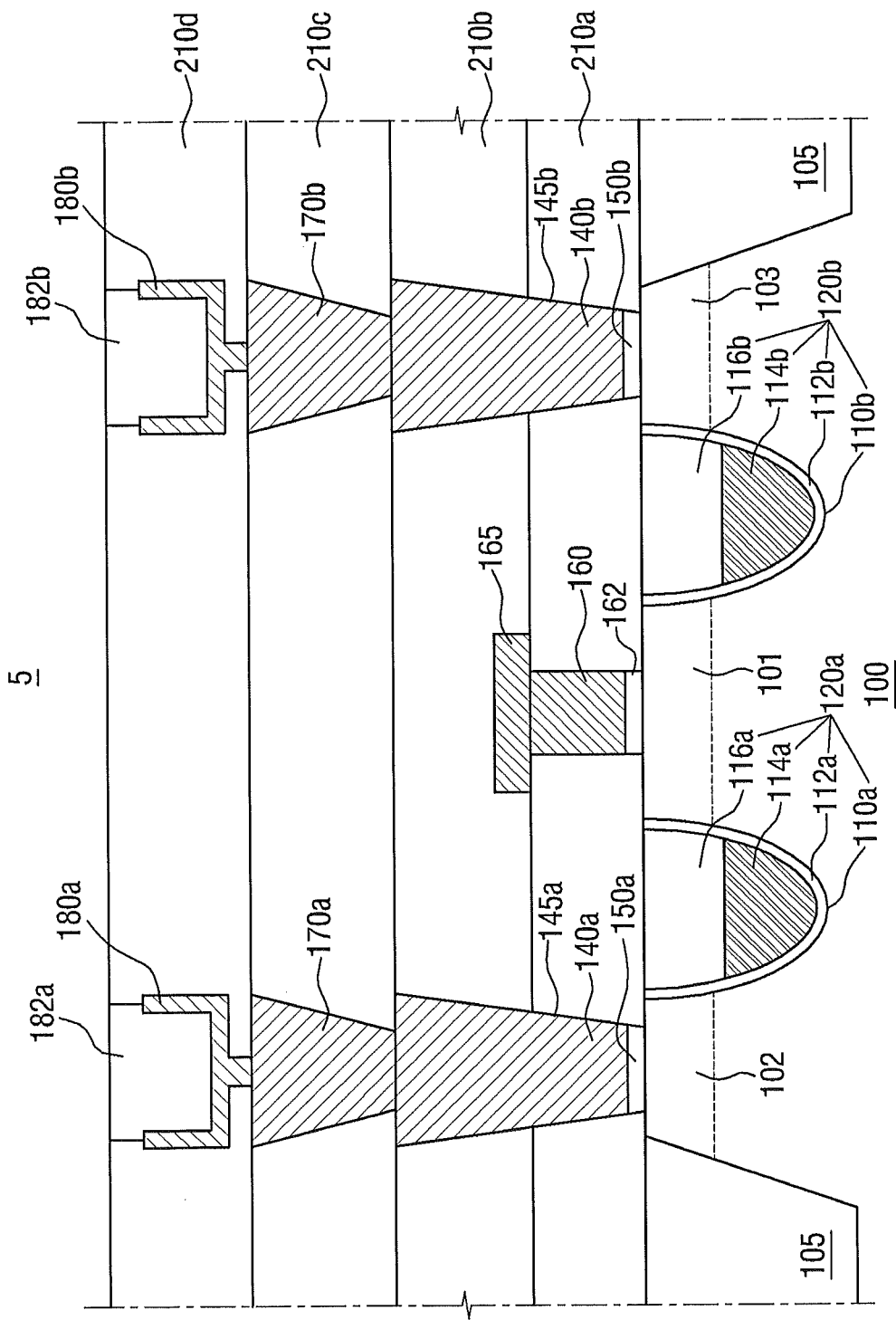
FIG. 32 is a cross-sectional view of a semiconductor device according to further embodiments of the present inventive concept.

FIG. 32 is a cross-sectional view of a semiconductor device according to further embodiments of the present inventive concept.

In the embodiments of FIG. 32 that follows, repeated descriptions of the same matters as those of previous embodiments will not be given and the following description will focus on differences between the previous and present embodiments.

Referring to FIG. 32, the semiconductor device 5 includes a metal oxide layer 162 between the bit line contact 160 and the source/drain region 101 as well as metal oxide layers 150a and 150b of the semiconductor device 1 shown in FIG. 3.

The bit line contact 160 may be a metal contact made of a metal. The bit line contact 160 may include W, Ti or Ru.

The metal oxide layer 162 may be formed on the first source/drain region 101. The metal oxide layer 162 may be formed at a lower portion of a trench 161 for forming the bit line contact 160. That is to say, the metal oxide layer 162 may be formed between the bit line contact 160 and the first source/drain region 101. When the unit active region 104 is an N type active region, the metal oxide layer 162 may include $La_2O_3$ and when the unit active region 104 is a P type active region, the metal oxide layer 162 may include $Al_2O_3$ or $TiO_2$.

What is claimed is:

1. A semiconductor device comprising:
a cell region;
a device isolation layer in the cell region;
an active region defined by the device isolation layer;
a buried gate in the active region;
a metal contact on the active region and positioned adjacent the buried gate;
a landing pad on the metal contact;
a capacitor on the landing pad and electrically connected to the active region through the landing pad and the metal contact; and
a metal oxide layer between the metal contact and the active region.

2. The semiconductor device of claim 1, wherein the active region comprises an N type active region and the metal oxide layer comprises $La_2O_3$.

3. The semiconductor device of claim 1, wherein the active region comprises a P type active region and the metal oxide layer comprises $Al_2O_3$ or $TiO_2$.

4. The semiconductor device of claim 1, wherein the active region comprises an N type active region, the buried gate comprises a first buried gate in the N type active region, the metal contact comprises a first metal contact on the N type active region positioned adjacent the first buried gate, the landing pad comprises a first landing pad on the first metal contact, the capacitor comprises a first capacitor on the first landing pad and electrically connected to the N type active region, and the metal oxide layer comprises a first metal oxide layer between the first metal contact and the N type active region, the first metal oxide layer having a first thickness;
wherein the semiconductor device further comprises:
a P type active region;
a second buried gate in the P type active region;
a second metal contact on the P type active region and positioned adjacent the second buried gate;
a second landing pad on the second metal contact;
a second capacitor on the second landing pad and electrically connected to the P type active region; and
a second metal oxide layer between the second metal contact and the P type active region, the second metal oxide layer having a second thickness.

5. The semiconductor device of claim 4, wherein the second thickness is greater than the first thickness, the first metal oxide layer comprises $La_2O_3$, and the second metal oxide layer comprises $TiO_2$.

6. The semiconductor device of claim 4, wherein the second thickness is equal to the first thickness, the first metal oxide layer comprises $La_2O_3$, and the second metal oxide layer comprises $TiO_2$.

7. The semiconductor device of claim 1, wherein the metal oxide layer is on opposing side surfaces of the metal contact and a bottom surface of the metal contact is on the active region.

8. The semiconductor device of claim 1, wherein the metal contact comprises W, Ti or Ru.

9. The semiconductor device of claim 1, wherein the metal contact and the landing pad are integrally formed.

10. The semiconductor device of claim 9, wherein the metal oxide layer is on opposing side surfaces of the metal contact and the landing pad and a bottom surface of the metal contact is on the active region.

11. A semiconductor device comprising:
a memory cell array comprising a plurality of memory cells;
a row decoder activating a selected word line of the memory cell array; and
a sense amplifier reading data from a selected bit line of the memory cell array,
wherein each of the plurality of memory cells comprises a cell capacitor, and a buried transistor connected between a bit line and the cell capacitor, and the buried transistor comprises an active region defined by a device isolation layer in a cell region, a buried channel array transistor in the active region, a metal contact on the active region positioned at one side of the buried transistor, and a metal oxide layer between the metal contact and the active region.

12. The semiconductor device of claim 11, wherein the buried transistor comprises a first buried transistor, the semiconductor device further comprising a second buried transistor, wherein the metal contact is between the first buried transistor and the second buried transistor.

13. The semiconductor device of claim 11, further comprising:
a second buried transistor;
a second metal contact adjacent the second buried transistor; and
a bit line contact;
wherein the buried transistor comprises a first buried transistor and the metal contact comprises a first metal contact; and
wherein the hit line contact is between the first buried transistor and the second buried transistor, and the first buried transistor and the second buried transistor are positioned between the first metal contact and the second metal contact.

14. The semiconductor device of claim 13, wherein the metal oxide layer is on opposing side surfaces of the first metal contact.

15. The semiconductor device of claim 13, further comprising a landing pad on the first metal contact, wherein the first metal contact and the landing pad are integrally formed, and wherein the metal oxide layer is on opposing side surfaces of the first metal contact and the landing pad.

16. A semiconductor device, comprising:
a semiconductor layer;
an active region in the semiconductor layer, the active region including first and second source/drain regions;
a trench in the active region between the first and second source/drain regions;
a gate insulation layer on sidewalls and on a bottom surface of the trench;
a buried gate in the trench on the gate insulation layer;
a metal contact on the first source/drain region; and
a metal oxide layer between the metal contact and the first source/drain region;
wherein a top surface of the metal oxide is higher than the active region.

17. The semiconductor device of claim 16, wherein the metal oxide layer extends onto sidewalls of the metal contact and wherein the metal oxide layer directly contacts both the metal contact and the first source/drain region.

18. The semiconductor device of claim 17, further comprising a landing pad on the metal contact, wherein the metal oxide layer extends onto sidewalls of the landing pad.

19. The semiconductor device of claim 16, further comprising a bit line contact on the second source/drain region, and a second metal oxide layer between the bit line contact and the second source/drain region.

20. The semiconductor device of claim 16, wherein the metal oxide layer comprises $La_2O_3$, $Al_2O_3$ or $TiO_2$.

* * * * *